US011881783B2

(12) United States Patent
Zou et al.

(10) Patent No.: US 11,881,783 B2
(45) Date of Patent: Jan. 23, 2024

(54) MANAGEMENT OF VOLTAGE REGULATOR UNITS IN FIELD PROGRAMMABLE ARRAYS

(71) Applicant: QUALCOMM Incorporated, San Diego, CA (US)

(72) Inventors: Peng Zou, Camas, WA (US); Xijian Lin, Fremont, CA (US); Gang Ren, Vancouver, WA (US); Joseph Dibene, Watsonville, CA (US); Syrus Ziai, Los Altos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 132 days.

(21) Appl. No.: 17/684,215

(22) Filed: Mar. 1, 2022

(65) Prior Publication Data

US 2023/0065469 A1    Mar. 2, 2023

Related U.S. Application Data

(60) Provisional application No. 63/237,485, filed on Aug. 26, 2021.

(51) Int. Cl.
*H02M 3/158*    (2006.01)
*H03K 19/17772*    (2020.01)
(Continued)

(52) U.S. Cl.
CPC ........... *H02M 3/1584* (2013.01); *H02M 1/08* (2013.01); *H03K 19/17772* (2013.01);
(Continued)

(58) Field of Classification Search
CPC .. H02M 3/1582; H02M 3/156; H02M 3/1584; H02M 3/1586; H02M 3/285;
(Continued)

(56) References Cited

U.S. PATENT DOCUMENTS 6,583,610 B2 *    6/2003    Groom ................... H02M 3/156
                                             323/224
8,971,077 B2 *    3/2015    Nakamoto ............... G05F 1/468
                                             363/79

(Continued)

OTHER PUBLICATIONS

International Search Report and Written Opinion for International Patent Application No. PCT/US2022/073681, dated Oct. 21, 2022, 14 pages.

*Primary Examiner* — Jeffrey A Gblende
(74) *Attorney, Agent, or Firm* — QUALCOMM Incorporated

(57) ABSTRACT

An electronic device has a power rail that is driven by voltage regulators and provides a rail voltage. Each voltage regulator has an output interface electrically coupled to the power rail to deliver up to a predefined regulator current to the power rail. In each voltage regulator, a voltage regulator controller has an input coupled to the output interface by a feedback path and controls a drive path coupled to the output interface. A bypass unit is coupled to the drive path and voltage regulator controller and operates in a standby mode or an operational mode. In the standby mode, the bypass unit bypasses the feedback path and the respective voltage regulator does not deliver current to the power rail, while in the operational mode, the bypass unit does not bypass the feedback path and the respective voltage regulator delivers up to the predefined regulator current to the power rail.

27 Claims, 12 Drawing Sheets

(51) Int. Cl.
*H02M 1/08* (2006.01)
*H01L 23/498* (2006.01)
*H01L 23/367* (2006.01)

(52) U.S. Cl.
CPC .... *H01L 23/3675* (2013.01); *H01L 23/49827* (2013.01); *H01L 23/49833* (2013.01); *H01L 23/49838* (2013.01)

(58) Field of Classification Search
CPC .... H02M 3/33561; H02M 7/49; H02M 1/045; H02M 7/006; H02M 7/06; H02M 7/068; H02M 7/153; H02M 7/10; H02M 1/088; H02M 7/103; H02M 7/106; H02M 7/19; H02M 7/08; H02M 7/17; H02M 2001/007; H02M 7/493; H02M 7/53806; H02M 7/5381; H02M 7/483; H02M 7/217; H02M 7/538466; H02M 7/5387; H02M 7/53871; H02M 7/53873; H02M 7/53875; H02M 1/084; H02M 1/0845; H02M 1/007; H02M 1/0009; H02M 1/08; H02M 3/1588; H02M 7/5395; H02M 1/14; H02J 3/46; H02J 3/38

See application file for complete search history.

(56) References Cited

U.S. PATENT DOCUMENTS

| | | | |
|---|---|---|---|
| 9,621,045 B2 * | 4/2017 | Tang | G01R 19/04 |
| 2007/0279950 A1 | 12/2007 | Sugiyama et al. | |
| 2015/0380930 A1 | 12/2015 | Smith | |
| 2021/0194366 A1 * | 6/2021 | Thatte | H03K 19/0016 |

* cited by examiner

*900*

_1000_

Generate a rail voltage and a rail current to the power rail 1002

> Each respective voltage regulator having an output interface coupled to the power rail and configured to provide the rail voltage and deliver up to a predefined regulator current to the power rail when the respective voltage regulator is in an operational mode 1004

Obtain a control setting for each respective voltage regulator of the plurality of voltage regulators 1006

> The control setting for each respective voltage regulator determining whether the respective voltage regulator is a standby voltage regulator in a standby mode or is an operational voltage regulator in the operational mode 1008

> Determine the control setting for each respective voltage regulator coupled to the power rail dynamically and in real time based on a load condition and a power state policy associated with the power rail 1014

At each standby voltage regulator, enable a bypass unit of the standby voltage regulator to bypass a feedback path from the output interface to an input of a voltage regulator controller, such that the standby voltage regulator does not deliver current to the power rail 1010

At each operational voltage regulator, disable the bypass unit from bypassing the feedback path, such that the respective voltage regulator delivers current to the power rail 1012

Figure 10

MANAGEMENT OF VOLTAGE REGULATOR UNITS IN FIELD PROGRAMMABLE ARRAYS

RELATED APPLICATIONS

This application claims priority to U.S. Provisional Patent Application No. 63/237,485, titled "Management of Voltage Regulator Units in Field Programmable Arrays," filed on Aug. 26, 2021, which is hereby incorporated by reference in its entirety.

BACKGROUND

An electronic device oftentimes integrates a system on a chip (SoC) with a power management integrated circuit (PMIC), communication ports, external memory or storage, and other peripheral function modules on a main logic board. The SoC includes one or more microprocessor or central processing unit (CPU) cores, memory, input/output ports, and secondary storage in a single package. The PMIC is typically disposed adjacent to the SoC on the main logic board, and provides multiple direct current (DC) power supply rails to the SoC via conductive wires formed on the main logic board. For each type of SoC, the PMIC and the conductive wires leading to the SoC need to be custom-designed based on at least the microprocessor or CPU cores included in the type of SoC.

SUMMARY

Various embodiments of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various embodiments are used to provide a semiconductor device that is configured to provide a semiconductor device or system with a generic PMIC that can adaptively support a variety of different types of SoCs having different microprocessor or CPU cores. A generic PMIC provides a plurality of power rails to power one or more clusters of processors of an SoC. The semiconductor device includes a plurality of voltage regulators, arranged in a field programmable array, and controlled to output power to the plurality of power rails of the SoC based on load information and power state policies associated with the one or more clusters of processors coupled to the power rails. In some embodiments, each voltage regulator in the field programmable array can be electrically decoupled from the plurality of power rails and become a redundant or standby voltage regulator without being entirely powered down, when a bypass unit (of the redundant or standby voltage regulator) operates in a standby mode to disable a feedback path between an output interface and an input of the redundant or standby voltage regulator.

Specifically, in one aspect, an electronic device includes a power rail configured to provide a rail voltage and a plurality of voltage regulators electrically coupled to the power rail and configured to provide the rail voltage collectively. Each of the plurality of voltage regulators includes an output interface, one or more drive paths, a voltage regulator controller, and a bypass unit. The output interface is coupled to the power rail and configured to provide the rail voltage and deliver up to a predefined regulator current to the power rail. The one or more drive paths are coupled to the output interface and configured to operate with an operating frequency. The voltage regulator controller has an output coupled to the one or more drive paths and an input coupled to the output interface by a feedback path, and is configured to control the one or more drive paths. The bypass unit is coupled to the one or more drive paths and the voltage regulator controller. Each respective voltage regulator of the plurality of voltage regulators is configured to operate in either a standby mode or an operational mode in accordance with a control setting. In the standby mode, the bypass unit is enabled to bypass the feedback path from the output interface to the input of the voltage regulator controller, and the respective voltage regulator does not deliver current to the power rail. In the operational mode, the bypass unit is disabled from bypassing the feedback path, and the respective voltage regulator delivers up to the predefined regulator current to the power rail.

In another aspect, a method is implemented for driving a power rail at an electronic device having a plurality of voltage regulators electrically coupled to the power rail. The method includes generating a rail voltage and a rail current to drive the power rail. Each respective voltage regulator has an output interface coupled to the power rail and is configured to provide the rail voltage and deliver up to a predefined regulator current to the power rail when the respective voltage regulator is in an operational mode. The method further includes obtaining a control setting for each respective voltage regulator of the plurality of voltage regulators. The control setting for each respective voltage regulator determines whether the respective voltage regulator is a standby voltage regulator operating in a standby mode or is an operational voltage regulator operating in the operational mode. The method further includes, at each standby voltage regulator, enabling a bypass unit of the standby voltage regulator to bypass a feedback path from the output interface to an input of a voltage regulator controller, such that the standby voltage regulator does not deliver current to the power rail. The method further includes, at each operational voltage regulator, disabling the bypass unit from bypassing the feedback path, such that the respective voltage regulator delivers current to the power rail.

These illustrative embodiments and implementations are mentioned not to limit or define the disclosure, but to provide examples to aid understanding thereof. Additional embodiments are discussed in the Detailed Description, and further description is provided there. Other implementations and advantages may be apparent to those skilled in the art in light of the descriptions and drawings in this specification.

BRIEF DESCRIPTION OF THE DRAWINGS

FIG. 10 is a flow diagram of a method for driving a power rail of an electronic device, in accordance with some embodiments.

Figure 1A:
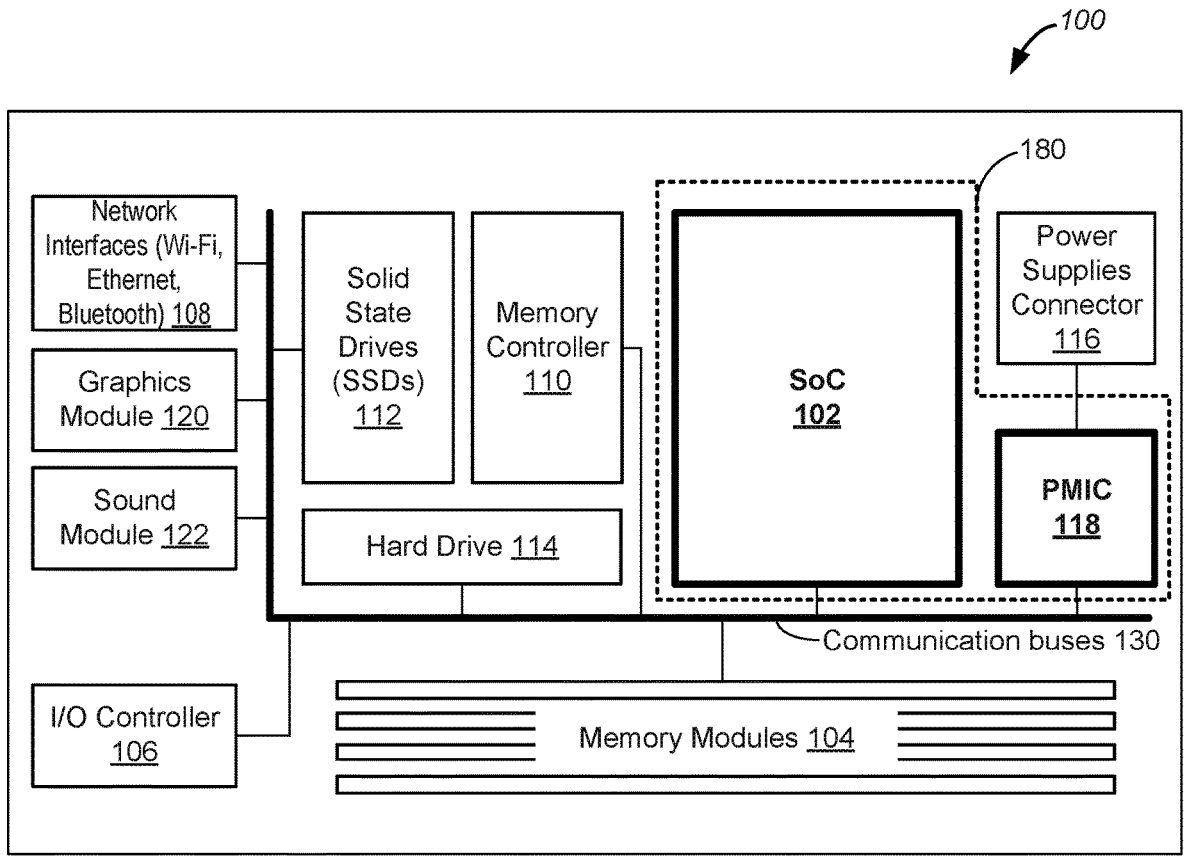
FIG. 1A is a block diagram of an example system module in a typical electronic device, in accordance with some embodiments.

For a better understanding of the various described implementations, reference should be made to the Detailed Description below, in conjunction with the following drawings in which like reference numerals refer to corresponding parts throughout the figures. Like reference numerals refer to corresponding parts throughout the drawings.

DESCRIPTION OF EMBODIMENTS

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details.

FIG. 1A is a block diagram of an example system module 100 in a typical electronic device, in accordance with some embodiments. System module 100 in this electronic device includes at least a system on a chip (SoC) 102, memory modules 104 for storing programs, instructions and data, an input/output (I/O) controller 106, one or more communication interfaces such as network interfaces 108, and one or more communication buses 130 for interconnecting these components. In some embodiments, I/O controller 106 allows SoC 102 to communicate with an I/O device (e.g., a keyboard, a mouse or a touch screen) via a universal serial bus interface. In some embodiments, network interfaces 108 includes one or more interfaces for Wi-Fi, Ethernet and Bluetooth networks, each allowing the electronic device to exchange data with an external source, e.g., a server or another electronic device. In some embodiments, communication buses 130 include circuitry (sometimes called a chipset) that interconnects and controls communications among various system components included in system module 100.

In some embodiments, memory modules 104 include high-speed random access memory, such as DRAM, SRAM, DDR RAM or other random access solid state memory devices. In some embodiments, memory modules 104 include non-volatile memory, such as one or more magnetic disk storage devices, optical disk storage devices, flash memory devices, or other non-volatile solid state storage devices. In some embodiments, memory modules 104, or alternatively the non-volatile memory device(s) within memory modules 104, include a non-transitory computer readable storage medium. In some embodiments, memory slots are reserved on system module 100 for receiving memory modules 104. Once inserted into the memory slots, memory modules 104 are integrated into system module 100.

In some embodiments, system module 100 further includes one or more components selected from:
- a memory controller 110 that controls communication between SoC 102 and memory components, including memory modules 104, in electronic device;
- solid state drives (SSDs) 112 that apply integrated circuit assemblies to store data in the electronic device, and in many embodiments, are based on NAND or NOR memory configurations;
- a hard drive 114 that is a conventional data storage device used for storing and retrieving digital information based on electromechanical magnetic disks;
- a power supply connector 116 that includes one or more direct current (DC) power supply interfaces each of which is configured to receive a distinct DC supply voltage;
- power management integrated circuit (PMIC) 118 that modulates the distinct DC supply voltages received via the DC power supply interfaces to other desired internal supply voltages (also called rail voltages), e.g., 5V, 3.3V or 1.8V, as required by various components or circuits (e.g., processor cores in the SoC 102) within electronic device;
- a graphics module 120 that generates a feed of output images to one or more display devices according to their desirable image/video formats; and
- a sound module 122 that facilitates the input and output of audio signals to and from the electronic device under control of computer programs.

It is noted that communication buses 130 also interconnect and control communications among various system components including components 110-122.

Further, one skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

In some embodiments, SoC 102 is implemented in a semiconductor package including one or more integrated circuits, and each integrate circuit integrates a subset of: one or more microprocessor or CPU cores, memory, input/output ports and secondary storage on a single substrate. PMIC 118 is also implemented in a semiconductor package including one or more integrated circuits each of which is formed on a single substrate. SoC 102 is configured to receive one or more internal supply voltages (also called rail voltages) provided by PMIC 118 via one or more power rails. In some embodiments, both SoC 102 and PMIC 118 are mounted on a main logic board, e.g., on two distinct areas of the main logic board, and electrically coupled to each other via conductive wires formed in the main logic board. This arrangement introduces parasitic effects and electrical noise that could compromise performance of the SoC, e.g., cause a voltage drop at an internal supply voltage. Alternatively, in accordance with various embodiments described with reference to FIG. 1B, semiconductor dies of SoC 102 and PMIC 118 are vertically packaged in an integrated semiconductor device, such that they are electrically coupled to each other via electrical connections that are not formed in the main logic board. Such vertical arrangement of the semiconductor dies of SoC 102 and PMIC 118 can reduce a length of electrical connections between SoC 102 and PMIC 118 and avoid performance degradation caused by routing the conductive wires on the main logic board.

In some embodiments, a generic PMIC 118 is configured to drive different types of SoCs 102 in different types of electronic devices. Regardless of whether PMIC 118 and SoC 102 are arranged side by side or vertically, PMIC 118 occupies the same footprint with respect to the main circuit board, while SoC 102 may have a distinct footprint based on the electronic modules integrated therein. PMIC 118 includes a plurality of voltage regulator units (e.g., regulators 320 in FIG. 3) that are arranged in a field programmable array (e.g., array 330 in FIG. 3). The plurality of voltage regulator units are identical to each other, or alternatively includes more than one type of voltage regulator unit. In a specific electronic device, control settings are determined based on rail voltages and rail currents of power rails required to power SOC 102 and other electronic modules, if any. For each of these power rails, a corresponding control setting is used to select a subset of voltage regulator units in the field programmable array of PMIC 118, and the selected voltage regulator units provide a rail current at a rail voltage to the respective power rail collectively. As such, PMIC 118 is reconfigured by these control settings to provide the rail voltages and currents to the power rails of SoC 102, and each voltage regulator unit in a plurality of configurable voltage regulators in PMIC 118 is either redundant or selected to drive one of the power rails by one of the control settings.

Figure 1B:
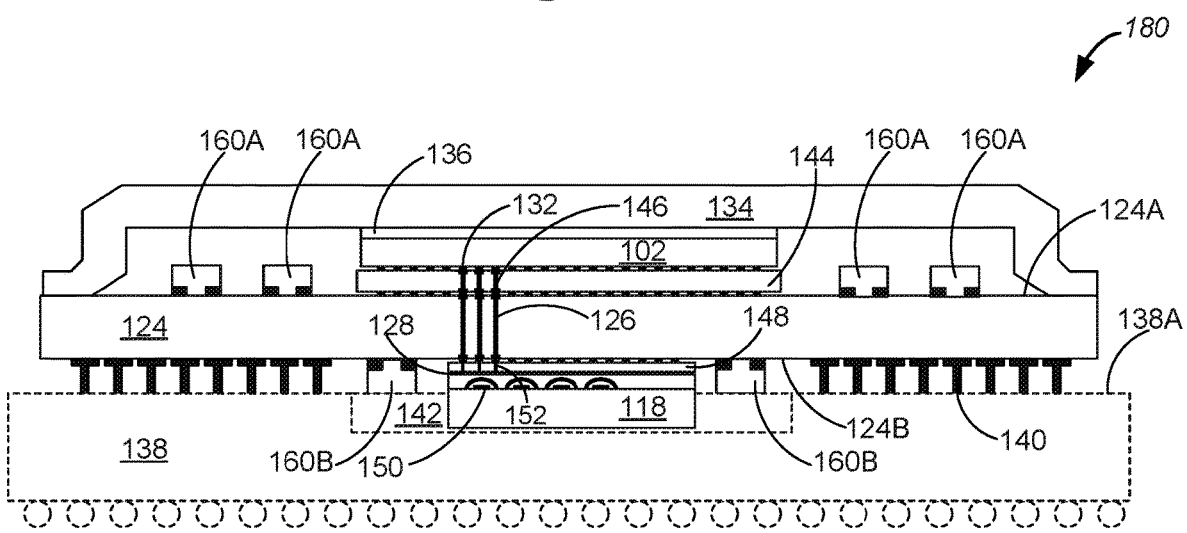
FIG. 1B is a cross sectional view of an integrated semiconductor device, in accordance with some embodiments.

FIG. 1B is a cross sectional view of an integrated semiconductor device 180 in which SoC 102 and PMIC 118 are vertically arranged, in accordance with some embodiments. Semiconductor device 180 integrates at least one SoC die 102 and at least one PMIC die 118 in a semiconductor package, and includes at least a package substrate 124 having a first surface 124A and a second surface 124B that is opposite to first surface 124A. SoC die 102 is disposed on first surface 124A of package substrate 124, and PMIC die 118 is mechanically coupled to second surface 124B of package substrate 124.

Package substrate 124 further includes a plurality of first via interconnects 126 that pass through a body of package substrate 124 and is exposed on both first and second surfaces 124A and 124B. PMIC die 118 is electrically coupled to SoC die 102 via the plurality of first via interconnects 126 of package substrate 124. Specifically, PMIC die 118 includes a plurality of DC connections 128 configured to output a plurality of rail voltages $V_R$, provided via a plurality of power rails to SoC die 102. When PMIC die 118 is mounted on second surface 124B of package substrate 124, DC connections 128 are electrically coupled to the plurality of first via interconnects 126 of package substrate 124. In some embodiments, SoC die 102 includes a plurality of power connections 132 configured to receive the plurality of rail voltages. When SoC die 102 is mounted on first surface 124A of package substrate 124, power connections 132 are electrically coupled to the plurality of first via interconnects 126 of package substrate 124. As such, PMIC die 118 is configured to provide DC power (i.e., rail voltages and rail current of power rails 206 in FIG. 2) to SoC die 102 via DC connections 128 of PMIC die 118, power connections 132 of SoC die 102, and first via interconnects 126 of package substrate 124. Further, by using very low impedance DC connections 128, the quality of the DC power provided PMIC die 118 to SoC die 102 is substantially improved relative to systems in which PMIC die 118 and SoC die 102 are separately packaged and positioned side by side on a main circuit board.

In some embodiments, power management interface 208 on PMIC die 118 is controlled by a master power management interface of SoC die 102, and configured to receive digital power control signals (e.g., carrying load information 314 in FIG. 3) from SoC die 102. A subset of first via interconnects 126 is configured to transfer the digital power control signals from SoC die 102 to PMIC die 118.

SoC die 102 has a first footprint on package substrate 124, and PMIC 118 has a second footprint on package substrate 124. In some embodiments, the first and second footprints at least partially overlap for the purposes of coupling DC connections 128 of PMIC die 118 and power connections 132 of SoC die 102 directly using the plurality of first via interconnects 126. In some situations, the first footprint of SoC die 102 is larger than and entirely encloses the second footprint of PMIC die 118. Alternatively, in some situations, the first footprint of SoC die 102 is offset from the second footprint of PMIC die 118, but at least partially overlaps the second footprint of PMIC die 118. DC connections 128 of PMIC die 118, power connections 132 of SoC die 102, and first via interconnects 126 of package substrate 124 are aligned and enclosed in an overlapped area of the first and second footprints.

Additionally, PMIC die 118 includes a plurality of thin film inductors 150 corresponding to the plurality of DC connections 128. The plurality of thin film inductors 150 is located adjacent to or facing second surface 124B of package substrate 124, e.g., on a top surface of PMIC die 118 facing second surface 124B of package substrate 124. Stated another way, the plurality of thin film inductors 150 is disposed between the top surface of PMIC die 118 and second surface 124B of package substrate 124. In some embodiments, PMIC die 118 is mechanically coupled to package substrate 124, e.g., via an adhesive. A height of the plurality of thin film inductors 150 is less than a predetermined threshold height (e.g., 1 mm, 100 μm) to maintain robustness of mechanical coupling between PMIC die 118 and package substrate 124. That said, vertical arrangement of the semiconductor dies of SoC 102 and PMIC 118 is facilitated in part by integration of thin film inductors 150 in a limited space between the dies of SoC 102 and PMIC 118. The thin film inductors are formed and integrated on a substrate of PMIC 118 and have an inductor height that is controlled to be less than the height of the limited space, such that the thin film inductors can fit into the limited space between the semiconductor dies of SoC 102 and PMIC 118. As the thin film inductors are formed on top of the substrate of PMIC 118, the thin film inductors can be directly connected to internal nodes or output nodes of PMIC 118, and no conductive wires of the main logic board are used to connect the thin film inductors to the internal or output nodes of PMIC 118.

In some embodiments, integrated semiconductor device 180 further includes a cover 134 coupled to first surface 124A of package substrate 124. Cover 134 is configured to conceal SoC die 102 and at least part of first surface 124A of package substrate 124, thereby protecting SoC die 102 and at least part of first surface 124A. Further, in some embodiments, cover 134 is made of an electrically conductive material and configured to be grounded to provide electrostatic shielding for SoC die 102 and any other circuit on first surface 124A, if completely concealed by cover 134, or the part of first surface 124A concealed by cover 134, if first surface 124A is only partially concealed by cover 134. In some situations, cover 134 is made of a thermally conductive material configured to dissipate heat generated by SoC die 102. In some embodiments, a thermal spreader 136, or layer of thermal spreader, is used to couple SoC die 102 to an interior surface of cover 134 to spread the heat generated by SoC die 102 evenly from SoC die 102 to cover 134.

In some embodiments, semiconductor device 180 further includes a socket substrate 138. Socket substrate 138 has a third surface 138A facing second surface 124B of package substrate 124. Package substrate 124 is electrically coupled to socket substrate 138 via a plurality of electrical connectors 140. Specifically, in some embodiments, second surface 124B of package substrate 124 includes a first area (e.g., a central area) to which PMIC die 118 is mechanically coupled and a second area (e.g., a peripheral area) where the plurality of electrical connectors 140 are located. In an example, the second area is adjacent to and surrounds the first area. It is noted that under some circumstances, semiconductor device 180 is provided with socket substrate 138. However, under some circumstances, socket substrate 138 is fixed on a circuit board of the electronic device in FIG. 1A, and is not part of integrated semiconductor device 180. Rather, semiconductor device 180 is a replaceable part that is provided to offer functions of a combination of PMIC die 118 and SoC die 102.

In some embodiments, third surface 138A of socket substrate 138 is substantially flat, and PMIC die 118 is disposed between second surface 124B of package substrate 124 and third surface 138A of socket substrate 138. A height of the plurality of thin film inductors 150 is less than a predetermined threshold height (e.g., 1 mm, 100 μm) that is determined by a difference between a length of electrical connectors 140 and a thickness of PMIC die 118. Alternatively, in some embodiments, socket substrate 138 includes a recessed portion 142, sometimes called a cavity, that is configured to receive PMIC die 118 when PMIC die 118 is mechanically and electrically coupled to second surface 124B of package substrate 124. A depth of recessed portion 142 is less than a thickness of socket substrate 138. In some situations, PMIC die 118 is suspended in recessed portion 142, i.e., separated from a bottom surface of recessed portion 142 by an air gap. Alternatively, in some situations, PMIC die 118 comes into contact with the bottom surface of recessed portion 142 directly or via an intermediate layer (e.g., an adhesive layer, a thermal spreader layer, or a layer that is both adhesive and a thermal spreader).

In some embodiments not shown in FIG. 1B, the depth of recessed portion 142 is equal to the thickness of socket substrate 138, and recessed portion 142 is an opening or cutoff in socket substrate 138. When socket substrate 138 is mounted on a circuit board (e.g., a main logic board), PMIC die 118 is suspended in recessed portion 142 (also called opening or cutoff), and at least partially surrounded by package substrate 124, socket substrate 138, and the circuit board.

In some embodiments, power connections 132 of SoC die 102 are not coupled to first via interconnects 126 of package substrate 124 directly. Rather, a first interposer 144 is disposed between SoC die 102 and first surface 124A of package substrate 124. First interposer 144 further includes a plurality of second via interconnects 146 configured to at least electrically couple power connections 132 of SoC die 102 and first via interconnects 126 of package substrate 124. Likewise, in some embodiments, DC connections 128 of PMIC die 118 are not coupled to first via interconnects 126 of package substrate 124 directly. Rather, a second interposer 148 is disposed between PMIC die 118 and second surface 124B of package substrate 124. Second interposer 148 further includes a plurality of third via interconnects 152 configured to at least electrically couple DC connections 128 of PMIC die 118 and first via interconnects 126 of package substrate 124. As such, a power rail 206 of SoC 102 includes at least power connection 132 of SoC die 102, first via interconnect 126 of package substrate 124, and DC connection 128 of PMIC die 118, and in some situations, further includes second via interconnect 146 of first interposer 144 and/or a third via interconnect 152 of second interposer 148.

In some embodiments, semiconductor device 180 further includes one or more discrete electronic modules 160 (e.g., resistor, capacitor, inductor, transistors, and logic chip). Discrete electronic modules 160 may be electrically coupled in an input/output interface circuit of SoC die 102 to control input/output coupling for SoC die 102. Optionally, a subset of discrete electronic modules 160 (e.g., components 160A) is disposed on first surface 124A of package substrate 124. Each component 160A may be contained within cover 134 or located outside cover 134. Optionally, a subset of discrete electronic modules 160 (e.g., components 160B) is mechanically coupled to second surface 124B of package substrate 124. If a respective component 160B has a low profile (e.g., thinner than a length of electrical connectors 140), component 160B may fit into a gap between second surface 124B of package substrate 124 and third surface 138A of socket substrate 138. Otherwise, if component 160B does not have a low profile (e.g., thicker than the length of electrical connectors 140), a respective component 160B can be received by recessed portion 142 of socket substrate 138 and disposed adjacent to PMIC die 118.

SoC die 102 and PMIC die 118 are vertically arranged in semiconductor device 180. Power connections 132 of SoC die 102 and DC connections 128 of PMIC die 118 are aligned and positioned in proximity to each other, thereby reducing parasitic resistance and capacitance coupled to each power rail 206 that provides a rail voltage to SoC die 102. It is noted that in some implementations, a plurality of PMIC dies 118 can be disposed in recessed portion 142 of socket substrate 138 and electrically coupled to one or more SoC dies 102 disposed on first surface 124A of package substrate 124. For example, two PMIC dies 118 are disposed in recessed portion 142 of socket substrate 138 to power four SoC dies 102 collectively. One of SoC dies 102 optionally corresponds to a microprocessor or CPU core or a cluster of microprocessor or CPU cores.

Additionally, in some embodiments, PMIC die 118 includes a field programmable array of voltage regulators that is configurable by control settings to drive different types of SoC dies 102. In some situations, multiple instances of the same PMIC die 118, package substrate 124, and socket substrate 138 are used to support different types of SoC dies 102. Recessed portion 142 formed on socket substrate 138 has a fixed size to accommodate the same PMIC die 118, and first via interconnects 126 that pass through the body of package substrate 124 have fixed locations. Alternatively, in some situations, while footprint sizes of package substrate 124 and socket substrate 138 are varied for different types of SoC dies 102, the same PMIC die 118 allows recessed portion 142 and first via interconnects 126 of package substrate 124 to remain unchanged, thereby avoiding the need for custom designs of PMIC die 118 and the entire package for each individual type of SoC die 102. As such, application of the field programmable array of voltage regulators in PMIC die 118 simplifies an assembly process and enhances cost efficiency of the semiconductor device 180.

Figure 2:
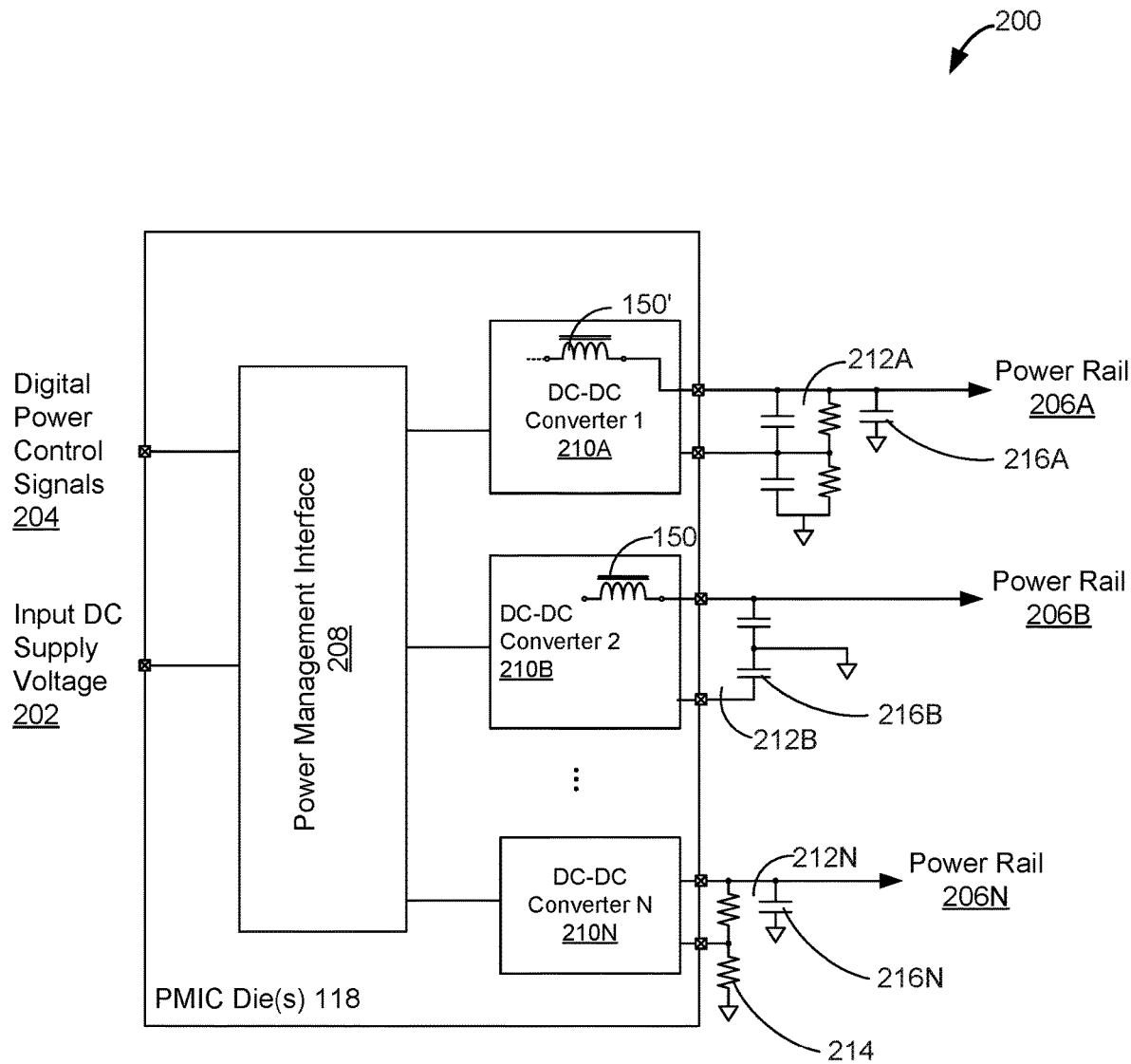
FIG. 2 is a block diagram of a power management system, in accordance with some embodiments.

FIG. 2 is a block diagram of a power management system 200 configured to provide power to one or more power rails 206 of an SoC, such as SoC 102, in accordance with some embodiments. Power management system 200 receives one or more input DC supply voltages 202 and digital power control signals 204, and converts the input DC supply voltage 202 to one or more rail voltages that are outputted by one or more power rails 206A, 206B to 206N and provided to SoC 102. Power management system 200 includes a power management interface 208, one or more DC-DC converters 210 (e.g., DC-DC converters 210A, 210B . . . 210N), and one or more output filters 212 (e.g., output filters 212A, 212B, . . . 212N). Power management interface 208 receives the input DC supply voltage(s) 202 and digital power control signals 204. In some embodiments, power management interface 208 is controlled by a master power management interface of a central processor unit (e.g., on SoC 102) and configured to receive digital power control signals 204 from SoC 102. DC-DC converters 210 are coupled to power management interface 208 and power rails 206, and are controlled by the digital power control signals 204 to generate the one or more rail voltages $V_R$, which are provided on power rails 206, from the input DC supply voltage(s) 202. Output filters 212 are coupled to DC-DC converters 210 and configured to reduce noise in and maintain stability of power rails 206 provided to SoC 102. In some embodiments, an output filter (e.g., any of 212A, 212B, . . . 212N) includes one or more respective output resistors 214 and one or more output capacitors 216 (e.g., 216A, 216B, . . . 216N). In some embodiments, an output filter (e.g., 212B) includes an inductor 150 and one or more output capacitors (e.g., capacitor 216B).

In some embodiments, power management system 200 is implemented on one or more PMIC dies 118, and each PMIC die 118 has a single substrate. In some embodiments, power management interface 208 and DC-DC converters 210 are formed on a substrate of a single PMIC die 118, e.g., belong to the same integrated circuit fabricated on the substrate of PMIC die 118. Conversely, in some embodiments, power management interface 208 and DC-DC converters 210 are formed on a plurality of substrates of a plurality of PMIC dies 118. In some embodiments, in addition to power management interface 208 and DC-DC converters 210, each PMIC die 118 further includes a plurality of thin film inductors that are fabricated or mounted on a top surface of the substrate of PMIC die 118. Optionally, the plurality of thin film inductors include one or more inductors 150 used in output filters 212. Optionally, the plurality of thin film inductors includes one or more inductors 150' used in DC-DC converters 210A. In some embodiments, in addition to power management interface 208, converters 210 and inductors 150/150', PMIC die 118 further integrates a subset of output resistors 214 and capacitors 216 of output filters 212. Alternatively, in some embodiments, PMIC 118 and SoC 102 are vertically arranged in an integrated semiconductor device 180, and a subset or all of capacitive and resistive components of output filters 212 are formed using discrete electronic modules 160 that are disposed on either surface of a package substrate 124.

In some embodiments, the power management system 200 includes a field programmable array of voltage regulator units, output filters 212, one or more output resistors 214, one or more output capacitors 216, and one or more inductors 150. Digital power control signals 204 are determined, e.g., by SoC 102, based on target power capabilities (e.g., rail voltages and rail currents) required for power rails 206. Stated another way, digital power control signals 204 are determined by load information and power state policies of power rails 206. A power state policy requires a power rail to meet at least one performance criterion (e.g., output ripple voltage, power supply rejection ratio, load transient response, output noise, and/or power efficiency). For example, each power rail 206 is configured to power a CPU cluster, a cache, or a functional block of SoC 102, which has a respective power demand that is used by SoC 102 to set forth a target power capacity of the respective power rail 206 that is controlled by a corresponding power state policy. In an example, the power state policy of a specific power rail 206 requires that the corresponding rail current of the specific power rail 206 be controlled to maximize one of a power conversion efficiency and a rail voltage response rate. In accordance with control signals 204, voltage regulator units in the field programmable array are partitioned and configured to form one or more DC-DC converters 210, e.g., DC-DC converters 210A, 210B, . . . 210N, to drive the power rails 206 in compliance with load information and power state policies associated with power rails 206. For each DC-DC converter 210, additional components 212-216 and 150 can also be selected and controlled by a respective subset of control signals 204 to enable desirable noise performance for the corresponding power rail 206.

Figure 3:
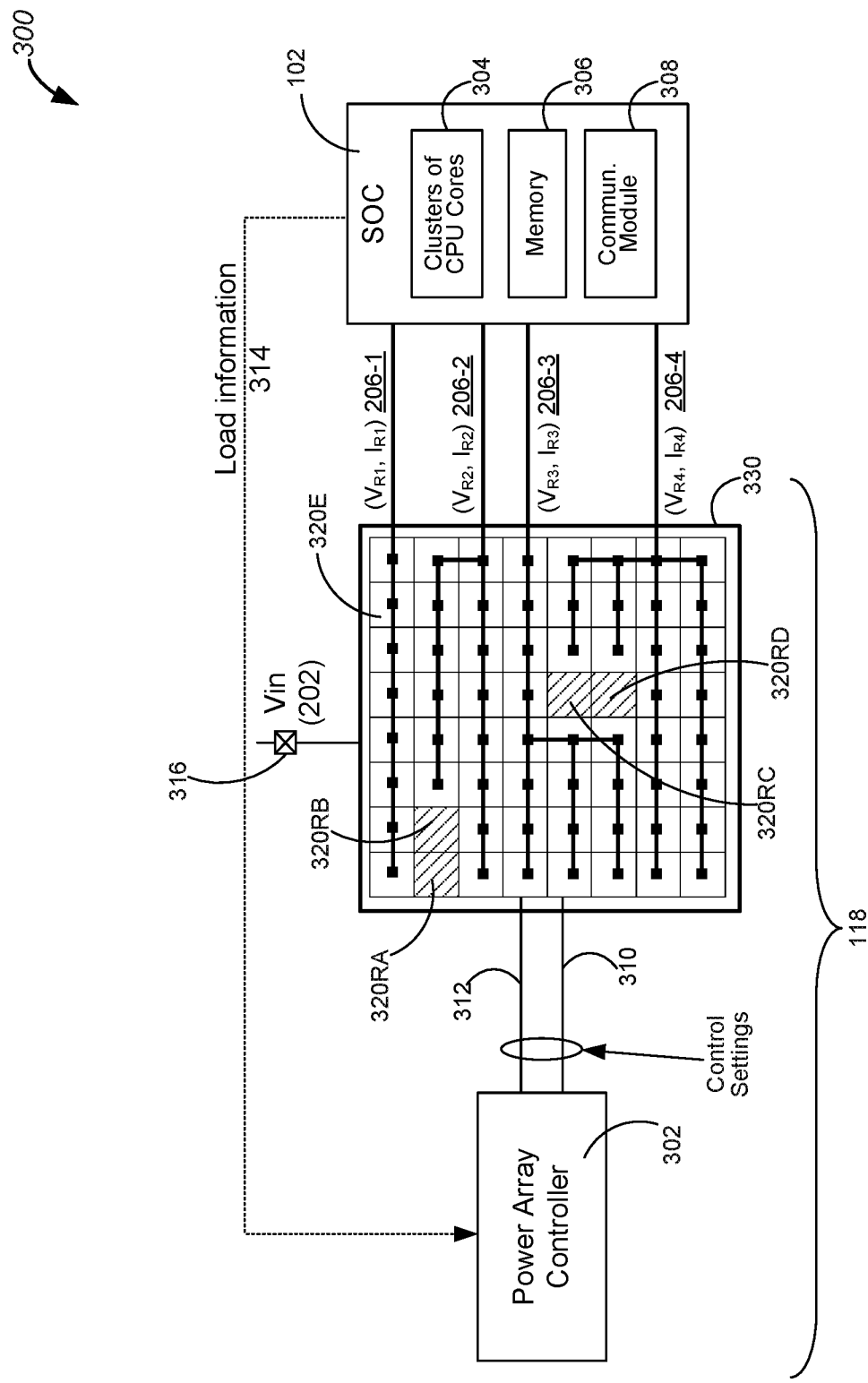
FIG. 3 is a simplified block diagram of an integrated semiconductor device including a plurality of voltage regulators for providing one or more power rails to an SoC, in accordance with some embodiments.

FIG. 3 is a simplified block diagram of an integrated semiconductor device 300 including a plurality of voltage regulators 320 for providing one or more power rails 206 to an SoC 102, in accordance with some embodiments. The plurality of voltage regulators 320 is arranged in a field programmable array 330. A power array controller 302 includes a plurality of electronic modules (e.g., one or more of SoC interface, oscillator, microcontroller, LDO, and reference generator), and is coupled to the plurality of voltage regulators 320. Power array controller 302 is configured to control the plurality of voltage regulators 320 to output power to a plurality of power rails 206. Each power rail 206 provides a respective rail current $I_R$ at a respective rail voltage $V_R$. In the example shown in FIG. 3, field programmable array 330 of voltage regulators 320 powers four power rails 206-1, 206-2, 206-3, and 206-4, and provides rail currents $I_{R1}$, $I_{R2}$, $I_{R3}$, and $I_{R4}$ at rail voltages $V_{R1}$, $V_{R2}$, $V_{R3}$, and $V_{R4}$, respectively. For each of the plurality of power rails 206, power array controller 302 determines the respective rail current $I_R$ associated with the respective power rail 206, selects a subset of voltage regulators 320 according to at least the respective rail current $I_R$, and enables the subset of voltage regulators 320 to generate the respective rail voltage $V_R$ and provide the respective rail current $I_R$ collectively. As such, power array controller 302 and voltage regulators 320 implement a power management system for SOC 102 on one or more PMIC dies 118.

SoC 102 includes a plurality of electronic components, e.g., one or more microprocessor or CPU cores 304, memory 306, communication modules 308, timing sources, peripherals (e.g., clocks, counter timers), analog interfaces, input/output ports, and/or secondary storage. The microprocessor or CPU cores 304 are optionally arranged in clusters. SoC 102 is implemented by one or more integrated circuits (e.g., SoC dies 102). Each SoC die 102 integrates a subset of the electronic modules of SoC 102 on a respective semiconductor substrate. In an example, SoC 102 has a main SoC die including one or more processor cores 304 and a companion SoC die including memory 306, analog interfaces, or other components distinct from the processor cores 304.

For each power rail 206, the respective rail voltage $V_R$ is determined by operation of the respective subset of the electronic components of SOC 102, and the respective rail current $I_R$ is determined by load information and a power state policy associated with the respective subset of the electronic components of SOC 102. Power array controller 302 is configured to determine a control value 310 based on at least the respective rail voltage $V_R$, select a selected subset of voltage regulators 320 based on at least the respective rail current $I_R$, and provide the determined control value 310 to a selected subset of voltage regulators 320 corresponding to the respective power rail 206, thereby enabling the subset of voltage regulators 320 to generate the respective rail voltage $V_R$ and provide the respective rail current $I_R$ collectively. Further, in some embodiments, power array controller 302 provides an operation enable signal 312 to the selected subset of voltage regulators corresponding to each power rail 206 to generate the respective rail voltage $V_R$ and provide the respective rail current $I_R$ collectively. As such, power array controller 302 is configured to provide a control setting including control value 310 and operation enable signal 312 to each voltage regulator 320, thereby selecting a distinct subset of voltage regulators 320 to provide the rail voltage $V_R$ and rail current $I_R$ to each power rail 206.

In some embodiments, power array controller 302 includes one or more processors and memory having instructions stored therein, which when executed by the one or more processors cause the processors to control voltage regulators 320 to output power to the plurality of power rails 206. VRU grouping configurations are optionally stored in memory of power array controller 302, an off-chip non-volatile memory (NVM) of system module 100, or a basic input/output system (BIOS) of system module 100 to associate control value 310 and enable signal 312 with the subset of voltage regulators for each of power rails 206. In some situations, the VRU grouping configurations are loaded and implemented by power array controller 302 when PMIC 118 is being powered up.

Each of the plurality of power rails 206 is configured to power a subset of the electronic modules of SOC 102, which becomes a load to the respective power rail 206. For each power rail 206, power array controller 302 is configured to determine load information 314 corresponding to an anticipated or actual load on the respective power rail 206, and determine the respective rail current $I_R$ associated with the respective power rail in accordance with load information 314 and a power state policy. The power state policy includes at least one performance criterion (e.g., output ripple voltage, power supply rejection ratio, load transient response, output noise, and/or power efficiency), and device 300 is configured to operate in compliance with the power state policy for each respective power rail. In some embodiments, a power rail 206 is coupled to the main SoC die having one or more processor cores 304 arranged in clusters, and the load information 314 of this power rail 206 corresponds to processor load information for one or more clusters of processors 304 of the main SoC die 102 coupled to this power rail 206. Examples of the processor load information include a total number of operations the types of operations to be performed by the one or more clusters of processors 304. Conversely, in some embodiments, one of the power rails 206 is coupled to a companion SoC die having memory 306, and is configured to power write and read operations on memory 306. The load information for that power rail 206 corresponds to memory load information for memory accesses of memory 306 on the companion SoC die. Examples of the memory load information include a memory type, a frequency of memory write operations, and a frequency of memory read operations of memory 306. As such, the rail current $I_R$ of each power rail 206 is adaptively determined based on the load information 314 (e.g., processor or memory load information) of the respective power rail 206. Further, in some embodiments, given the load information of each power rail 206, a respective power state policy of power rail 206 requires that the corresponding rail current $I_R$ of power rail 206 be controlled to maximize one of a power conversion efficiency and a rail voltage response rate. In an example, in accordance with the power state policy, power rail 206 offers a maximum rail current at a startup of power rail 206, so as to allow the rail voltage to reach the rail voltage $V_R$ within a transient load response time.

Additionally, in some embodiments, each of the plurality of voltage regulators 320 in field programmable array 330 corresponds to a respective voltage regulator type selected from a plurality of predefined voltage regulator types. For each power rail 206, the selected subset of voltage regulators 320 corresponds to a respective voltage regulator type that is determined based on at least one performance criterion (e.g., one or more of a maximum rail current $I_{RLM}$, maximum regulator current $I_{RGM}$, output ripple voltage, power supply rejection ratio, load transient response, output noise, and power efficiency).

Referring to FIG. 3, after a respective subset of voltage regulators 320 is selected for each power rail 206, each voltage regulator 320 in the subset is uniquely associated with the respective power rail 206 at a certain time. For example, at a first time, power rails 206-1, 206-2, 206-3, and 206-4 are associated with four distinct sets of voltage regulators 320 as shown in FIG. 3. Each voltage regulator 320 in the first row is uniquely associated with power rail 206-1 at the first time, and cannot be associated with any of power rails 206-2, 206-3, and 206-4 at the same first time. However, at a second time distinct from the first time, voltage regulators 320 in field programmable array 330 may be reconfigured to power distinct power rails 206. Each voltage regulator 320 in the first row is uniquely associated with power rail 206-1 at the first time, but can be reconfigured to drive any of power rails 206-2, 206-3, and 206-4 at the second time. More generally, in some embodiments, at least a plurality of the voltage regulators 320 in the field programmable array 330 can be configured to provide, at any one time, power to a selected power rail 206 of a plurality of power rails. Thus, in some embodiments, a subset of the voltage regulators 320 are permanently assigned to certain power rails 206, while others are configurable as to which power rail 206 they are connected to. In some other embodiments, all of the voltage regulators 320 in the field programmable array 330 are configurable as to which power rail 206 they are connected to.

Each respective voltage regulator 320 has at least two modes including an operational mode and a standby mode. In the operational mode, a respective voltage regulator 320 outputs a rail voltage $V_R$ to one of the plurality of power rails 206 with which respective voltage regulator 320 is associated, and delivers up to a predefined regulator current $I_R$ to associated power rail 206. Conversely, the standby mode is applied when respective voltage regulator 320 (e.g., 320RA-320RD) is not assigned to drive any power rail 206 and when respective voltage regulator 320 (e.g., 320E) is temporarily disabled from delivering current to a power rail 206 to which respective voltage regulator 320 is assigned. Specifically, in the example shown in FIG. 3, voltage regulators 320RA-320RD in field programmable array 330 are redundant and not associated with any power rail 206. Such voltage regulators 320RA-320RD operate in the standby mode, and do not exit the standby mode until voltage regulators 320RA-320RD are reassigned to drive one or more power rails 206. As to each voltage regulator 320 that is assigned to a respective power rail 206, a respective voltage regulator 320 can be disabled from delivering current to the respective power rail 206 at a first duty cycle corresponding to the standby mode. At a second duty cycle that is distinct from the first duty cycle and corresponds to the operational mode, the respective voltage regulator 320 can be activated to provide power and deliver current to the respective power rail 206. For example, voltage regulator 320E associated with power rail 206-1 can operate with alternating duty cycles corresponding to the standby mode in which voltage regulator 320 does not deliver current to power rail 206-1 and the operational mode in which voltage regulator 320 is enabled to deliver current to power rail 206-1.

More specifically, in some embodiments, each voltage regulator 320 (e.g., voltage regulator 320RA-320RD and 320E) includes a bypass unit configured to provide a dummy load component. In the standby mode, the bypass unit is enabled to bypass a feedback path from an output interface to an input of the voltage regulator 320 (e.g., under the control of operation enable signal 312), thereby disabling the respective voltage regulator 320 from contributing to any rail current $I_R$ via the output interface. In the operational mode, the bypass unit is disabled from bypassing the feedback path, and voltage regulator operates with the feedback path to enable the output interface to output the rail voltage $V_R$ and part of rail current $I_R$ to a corresponding power rail 206. More details on the bypass unit are provided below with reference to FIGS. 5B and 6-10.

In some embodiments, the semiconductor device 300 further includes one or more direct current (DC) power supply interfaces 316. Each DC power supply interface 316 is configured to receive a distinct DC supply voltage $V_{IN}$ 202. Each voltage regulator 320 is coupled to a respective subset of the one or more DC power supply interfaces 316 and configured to be powered by a corresponding DC supply voltage $V_{IN}$ 202 and generate the respective rail voltage $V_R$ from the corresponding DC supply voltage $V_{IN}$ 202.

Figure 4A:
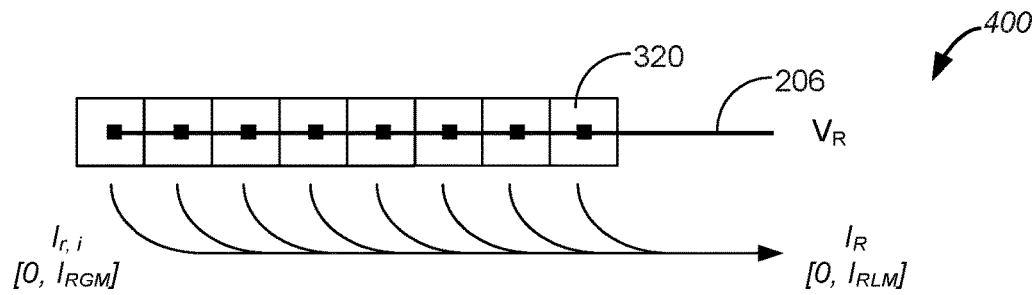
FIG. 4A illustrates a process of providing a rail current $I_R$ at a rail voltage $V_R$ using a subset of voltage regulators in accordance with some embodiments.
Figure 4B:
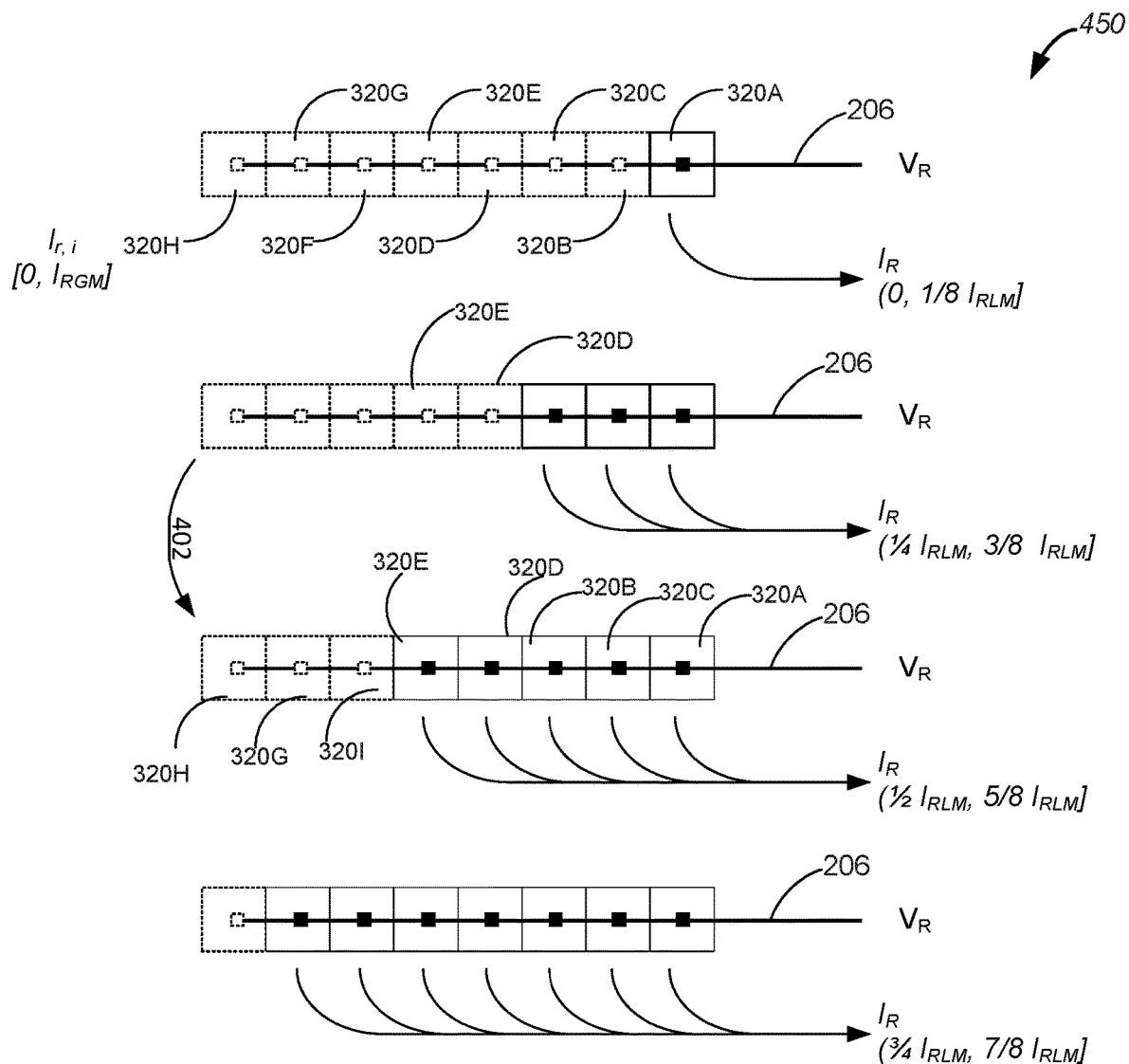
FIG. 4B illustrates processes of providing a rail current $I_R$ at a rail voltage $V_R$ based on one or more redundant voltage regulators, in accordance with some embodiments.

FIG. 4A illustrates a process 400 of providing a rail current $I_R$ at a rail voltage $V_R$ using a subset of voltage regulators 320 in accordance with some embodiments, and FIG. 4B illustrates processes 450 of providing a rail current $I_R$ at a rail voltage $V_R$ based on one or more redundant voltage regulators 320, in accordance with some embodiments. The rail current $I_R$ can vary between 0 and a maximum rail current $I_{RLM}$. Each of the subset of voltage regulators 320 is configured to provide a regulator current up to a maximum regulator current $I_{RGM}$. The subset of voltage regulators 320 has a first number of voltage regulators corresponding to a ratio of the maximum rail current $I_{RLM}$ and the maximum regulator current $I_{RGM}$. For example, in FIG. 3, the first power rail 206-1 is required to output the maximum rail current $I_{RLM}$, and each voltage regulator 320 can provide a respective regulator current up to the maximum regulator current $I_{RGM}$. In accordance with the maximum rail current $I_{RLM}$ (e.g., 0.6 A) and maximum regulator current $I_{RGM}$ (e.g., 80 mA), 8 voltage regulators are required to provide power rail 206-1 with the rail current $I_R$ up to the maximum rail current $I_{RLM}$.

In some embodiments, the maximum rail current $I_{RLM}$ is applied during a startup of power rail 206, so as to reach the rail voltage $V_R$ within a transient load response time, and the power rail 206 subsequently operates an operation current that is less than the maximum rail current $I_{RLM}$. Power rail 206 is configured to reach the rail voltage $V_R$ within the transient load response time at each startup of the power rail 206. Providing sufficient power to the power rail so as to reach rail voltage $V_R$ within the transient load response time is enabled by providing the maximum regulator current $I_{RGM}$ and maximum rail current $I_{RLM}$ during startup, and therefore, the first number of voltage regulators 320 is determined in part based on the transient load response time required for the startup of the power rail 206. In some embodiments, however, when ramping up the voltage on a respective power rail 206 at startup of the power rail, the current provided by the power management system 500 is significantly less than the maximum rail current for that power rail, to reduce system stress, avoid overshoot, etc.

During operation (sometimes herein called normal operation, as opposed to startup) of the power rail 206, the operation current $I_R$ powering SoC 102 varies and does not exceed the maximum rail current $I_{RLM}$. Conversely, in some embodiments, the maximum rail current $I_{RLM}$ is reached, at least occasionally, during normal operation of the power rail 206, when the rail current $I_R$ is used to power operation of SoC 102. The operation current varies between 0 and the maximum rail current $I_{RLM}$. During normal operation, as opposed to startup, of the power rail 206, the first number of voltage 320 regulators is determined based on the operation current of the power rail 206, rather than the transient load response time of the power rail 206 at each startup. The transient load response time of the power rail 206 can be achieved by a transient rail current that is less than the maximum rail current $I_{RLM}$.

Referring to FIG. 4A, power rail 206 has an instant rail current $I_R$ at a respective time, independently of whether the respective time corresponds to a startup or normal operation of power rail 206. In some embodiments, power array controller 302 generates control settings (e.g., control value 310 and operation enable signal 312) to enable all of the subset of voltage regulators 320 to provide the instant rail current $I_R$ of the power rail 206 collectively. Stated another way, in some embodiments, none of the subset of voltage regulators 320 operates in a standby mode as the instant rail current $I_R$ varies between 0 and the maximum rail current $I_{RLM}$. For example, first power rail 206-1 (FIG. 3) outputs an instant rail current $I_R$ that is equal to 0.5 $I_{RLM}$ at a particular time, and all 8 voltage regulators configured to provide the maximum rail current $I_{RLM}$ are enabled while being controlled by power array controller 302 to collectively provide only 0.5 $I_{RLM}$. Thus, in this example, only a portion of the power capability of each voltage regulator 320 is utilized. In some situations, the rail voltage $V_R$ associated with the instant rail current $I_R$ differs from the rail voltage $V_R$ associated with the maximum rail current $I_{RLM}$ by a first rail voltage error. The power array controller 302 and/or voltage regulators 320 are configured to maintain (e.g., limit, or control) the first rail voltage error within a rail drift tolerance $V_{RT}$.

Further, in some embodiments, the subset of voltage regulators 320 are controlled to contribute to the instant rail current $I_R$ substantially equally. For example, each voltage regulator 320 provides a respective portion to the instant rail current $I_R$, and the portion varies less than 5% (or 10%, 20% or other predefined margin) among the voltage regulators 320 configured to provide power to the same power rail 206. Each voltage regulator 320 may include an inter-regulator balancing circuit to balance the portion of the respective rail current $I_R$ provided by the respective voltage regulator 320 with at least another portion of the respective rail current $I_R$ provided by a distinct voltage regulator 320 in the subset of voltage regulators 320. In some implementations, the inter-regulator balancing circuit is internal to each voltage regulator 320, and uses the portion of the respective rail current $I_R$ provided by the respective voltage regulator 320 as a negative feedback to control the portion of the respective rail current $I_R$ internally and independently of the other voltage regulators configured to provide power to the same power rail 206.

Referring to FIG. 4B, in some embodiments, one or more voltage regulators 320 are disabled in the subset of voltage regulators 320 and operate in a standby mode, e.g., under the control of operation enable signal 312, while a remainder of the subset of the voltage regulators 320 is enabled to provide the instant rail current $I_R$ of the corresponding power rail collectively. The one or more voltage regulators 320 have a second number of voltage regulators 320, and the second number is determined in accordance with a comparison between (e.g., ratio of) the instant rail current $I_R$ and the maximum regulator current $I_{RGM}$, or equivalently, in accordance with a comparison between (e.g., ratio of) the instant rail current $I_R$ and the maximum rail current $I_{RLM}$. For example, the subset of voltage regulators 320 has 8 voltage regulators, and the second number is equal to a value between 1 and 7. If the instant rail current $I_R$ is in a first range, e.g., $(0, \frac{1}{8} I_{RLM}]$, a first voltage regulator 320A is enabled to provide the instant rail current $I_R$. If the instant rail current $I_R$ increases to exceed $\frac{1}{8} I_{RLM}$, $\frac{1}{4} I_{RLM}$, $\frac{3}{8} I_{RLM}$, $\frac{1}{2} I_{RLM}$, $\frac{5}{8} I_{RLM}$, $\frac{3}{4} I_{RLM}$, and $\frac{7}{8} I_{RLM}$, at respective times, voltage regulators 320B, 320C, 320D, 320E, 320F, 320G, and 320H are enabled (e.g., gradually or successively enabled) to provide the instant rail current $I_R$ in corresponding rail current ranges, at those respective times. Further, in some embodiments, while the second number of voltage regulators 320 operate in the standby mode, the remainder of the subset of the voltage regulators 320 is controlled to contribute to the instant rail current $I_R$ substantially equally, e.g., each enabled operational voltage regulator 320 provides a respective portion to the instant rail current $I_R$ that varies less than 5% (or 10%, 20% or other predefined margin) among voltage regulators 320 associated with the same power rail 206.

In some situations, when one or more voltage regulators 320 operate in the standby mode, the rail voltage $V_R$ associated with the instant rail current $I_R$ is distinct from the rail voltage $V_R$ associated with the maximum rail current $I_{RLM}$ by a second rail voltage error. The second rail voltage error is controlled (e.g., by the power array controller 302 and/or voltage regulators 320) so as to maintain (e.g., limit, or control) the second rail voltage error within the rail drift tolerance $V_{RT}$. When the same rail current $I_R$ is provided with at least one redundant regulator (FIG. 4B) or without redundant regulators (FIG. 4A), the second rail voltage error is less than the first rail voltage error, and involvement of the redundant regulator(s) 320 provides a higher accuracy for the rail voltage $V_R$ with more complicated regulator controls.

As explained above, each power rail 206 corresponds to a respective first number of voltage regulators 320 in which a respective second number of voltage regulators 320 are enabled at a time to operate in the standby mode, and the respective second number varies dynamically in accordance with the instant rail current $I_R$. The second number is determined based on load information 314 and a power state policy that is configured to meet at least one performance criterion (e.g., output ripple voltage, power supply rejection ratio, load transient response, output noise, and/or power efficiency). In an example, the second number of voltage regulator 320 is dynamically adjusted to maximize a power conversion efficiency for driving the power rail. Stated another way, in some embodiments, at any point in time while the electronic device is powered on and providing power to one or more other semiconductor devices (e.g., SoC 102) via a power rail 206, a first subset of the voltage regulators 320 are in the operational mode and a second subset of the voltage regulators 320 are in the bypass mode, as specified by control settings (e.g., operation enable signal 312) of the respective voltage regulators. The control settings are determined based on the load information 314 and power state policy by power array controller 302.

During a regulator adjustment process 402, additional voltage regulators 320D and 320E switch from the standby mode to the operational mode. Internal voltage regulator controllers of voltage regulators 320A-320E that drive the power rail 206 dynamically adjust operating points of these voltage regulators 320A-320E to correct a rail voltage error of the rail voltage $V_R$ associated with the instant rail current $I_R$. This regulator adjustment process 402 is relatively slow due to a time constant of loop control filters involved in voltage regulators 320A-320E. Particularly, control loops of the additional voltage regulators 320D and 320E that switch between the modes may disturb operation of control loops of the remainder of voltage regulators 320A-320C that have driven the power rail 206 in the operational mode, causing a deviation of a rail voltage $V_R$ of the power rail 206. As such, in some embodiments, any of redundant voltage regulators 320B-320H that operates in the standby mode is biased to the same operating points (e.g., including the same output voltage of the rail voltage $V_R$) as other operational voltage regulators of the same power rail 206. This helps reduce the disturbance to the output of operational voltage regulators 320 (i.e., the rail voltage $V_R$) when redundant voltage regulator(s) 320 join the operational voltage regulator(s) 320 in driving the power rail 206. Given the same operating points, each respective voltage regulator 320 associated with power rail 206 is configured to transition from the standby mode to the operational mode and provide a predefined regulator current to power rail 206 within a predefined period of time, e.g., within 1, 2, 5, or 10 microseconds.

Figure 5A:
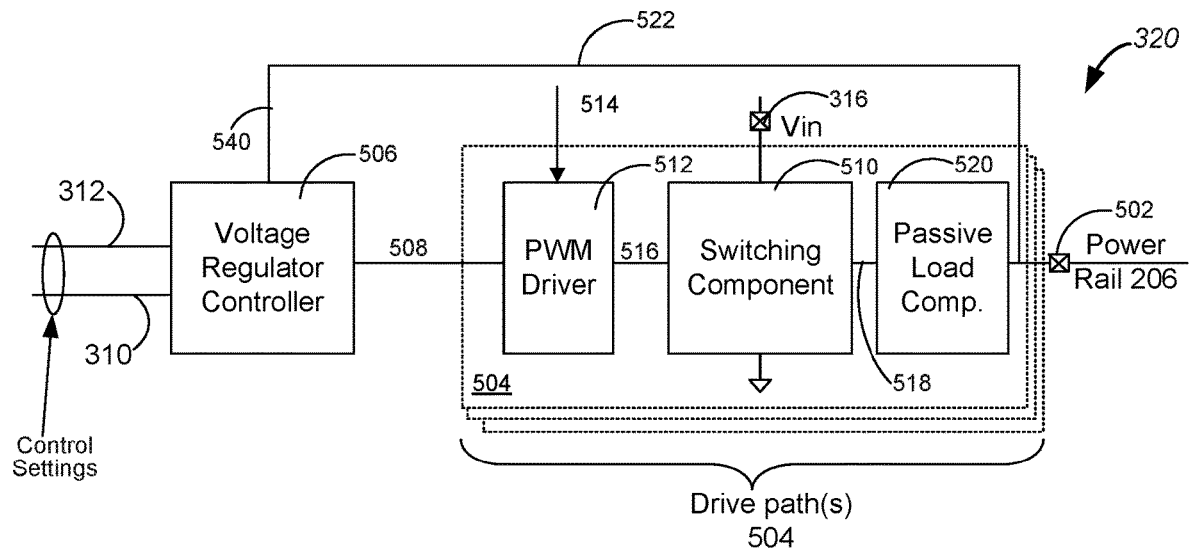
FIG. 5A is a block diagram of a voltage regulator, which is one of the voltage regulators in a field programmable array, in accordance with some embodiments.

FIG. 5A is a block diagram of a voltage regulator 320, which is one of the voltage regulators in field programmable array 330, in accordance with some embodiments. In field programmable array 330, a power rail 206 is electrically coupled to a plurality of voltage regulators 320 configured to provide a corresponding rail voltage $V_R$ collectively to that power rail 206. Each voltage regulator 320 includes an output interface 502, one or more drive paths 504, and a voltage regulator controller 506. Output interface 502 is electrically coupled to power rail 206 to output the rail voltage $V_R$. The one or more drive paths 504 are coupled in parallel between voltage regulator controller 506 and output interface 502, and each drive path 504 is configured to operate during a respective phase and with an operating frequency to provide a respective path current $I_P$ to the power rail 206. The respective path current $I_P$ becomes a portion of a rail current $I_R$ injected to power rail 206. Voltage regulator controller 506 is configured to receive a control setting (e.g., control value 310 and operation enable signal 312) from a power array controller 302 and generate a path control signal 508 to control the one or more drive paths 504.

Voltage regulator 320 includes a feedback path 522 coupling output interface 502 to voltage regulator controller 506. That said, voltage regulator controller 506 has a feedback input 540 configured to receive an output voltage of output interface 502. Voltage regulator controller 506 is configured to adjust path control signal 508 dynamically based on the output voltage of output interface 502 and generate the rail voltage $V_R$ as defined by control value 310. Specifically, in some embodiments, path control signal 508 defines a duty cycle that is dynamically adjusted by voltage regulator controller 506 in accordance with a comparison of the output voltage of output interface 502 with the rail voltage $V_R$ as defined by control value 310.

In some embodiments, voltage regulator 320 includes a buck converter, i.e., a DC-DC switch mode converter, which operates based on an integrated switch. Each drive path 504 includes a switch component 510 and a pulse width modulation (PWM) driver 512. PWM driver 512 is coupled between voltage regulator controller 506 and switch component 510. PWM driver 512 receives a periodic signal 514 (e.g., having a sinusoidal, square, triangle, or sawtooth waveform) and path control signal 508 to control switch component 510. Specifically, path control signal 508 defines a duty cycle, and periodic signal 514 has a frequency equal to the operating frequency of the one or more drive paths 504. PWM driver 512 is configured to modify periodic signal 514 with path control signal 508 to generate a switching signal 516. Switch component 510 is controlled by switching signal 516 to turn on and off according to the duty cycle, at the operating frequency. Switch component 510 is also coupled to a DC power supply interface 316 and configured to be powered by a corresponding DC supply voltage $V_{IN}$, which is thereby output to a switch output 518 of switch component 510 according to the duty cycle and with the operating frequency. Switch output 518 of switch component 510 is further conditioned (e.g., filtered) by a passive load component 520 to generate the rail voltage $V_R$. The rail voltage $V_R$ is output to power rail 206 via output interface 502. In some implementation, the rail voltage $V_R$ is substantially constant (e.g., has an output ripple voltage less than a ripple tolerance), and has an average magnitude equal to a product of the DC supply voltage $V_{IN}$, the duty cycle, and a conversion efficiency of switch component 510.

Figure 5B:
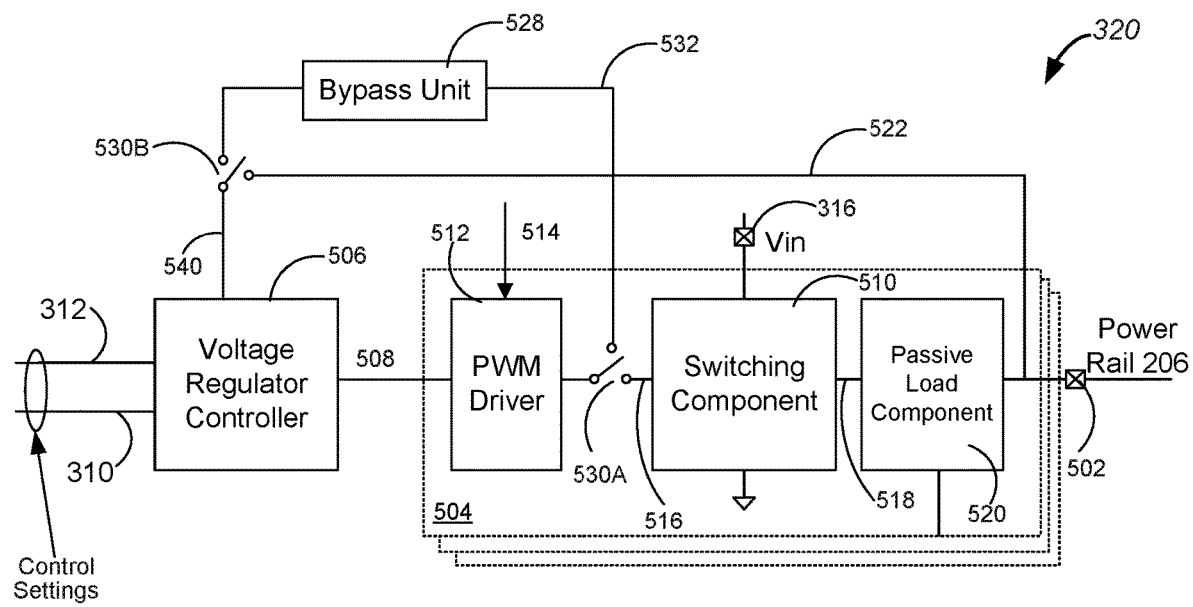
FIG. 5B is a block diagram of a voltage regulator having a bypass unit, in accordance with some embodiments.

FIG. 5B is a block diagram of a voltage regulator 320 that further includes a bypass unit 528, internal to voltage regulator 320. In some embodiments, each individual voltage regulator 320 controls current outputs using bypass unit 528, independently of any other voltage regulator 320 configured to drive the same power rail 206. Bypass unit 528 is used to enable a standby mode in which voltage regulator 320 is disabled from contributing to a rail current $I_R$ of a corresponding power rail 206. The standby mode is optionally applied when voltage regulator 320 (e.g., 320E in FIG. 3) is applied to drive a power rail 206 or when voltage regulator 320 (e.g., 320RA-320RD in FIG. 3) is not applied to drive any power rail 206. Bypass unit 528 is coupled to the one or more drive paths 504 and voltage regulator controller 506, and is configured to provide a dummy load component (e.g., including a passive RC filter or an active filter) in place of a load coupled to power rail 206 when the voltage regulator 320 is in standby mode.

In the standby mode, bypass unit 528 is enabled to bypass feedback path 522 from output interface 502 to the input of voltage regulator controller 506, thereby disabling voltage regulator 320 from contributing to the respective rail current $I_R$. In an example as shown in FIG. 5B, a first switch 530A is inserted into, and breaks, an interconnect carrying switching signal 516 in each drive path 504, and a switch 530B is inserted into, and breaks, feedback path 522. In some implementations, each of switches 530A and 530B includes a multiplexer, and is controlled by operation enable signal 312 received by voltage regulator 320. Bypass unit 528 is coupled between switch 530A of each drive path 504 and switch 530B, and configured to intercept switching signal 516 and decouple power rail 206 and feedback path 522 from voltage regulator controller 506. As such, bypass unit 528 enables an auxiliary path 532 to bypass feedback path 522 in the standby mode. An example of an implementation of bypass unit 528 is shown in FIG. 6, described below.

Figure 6:
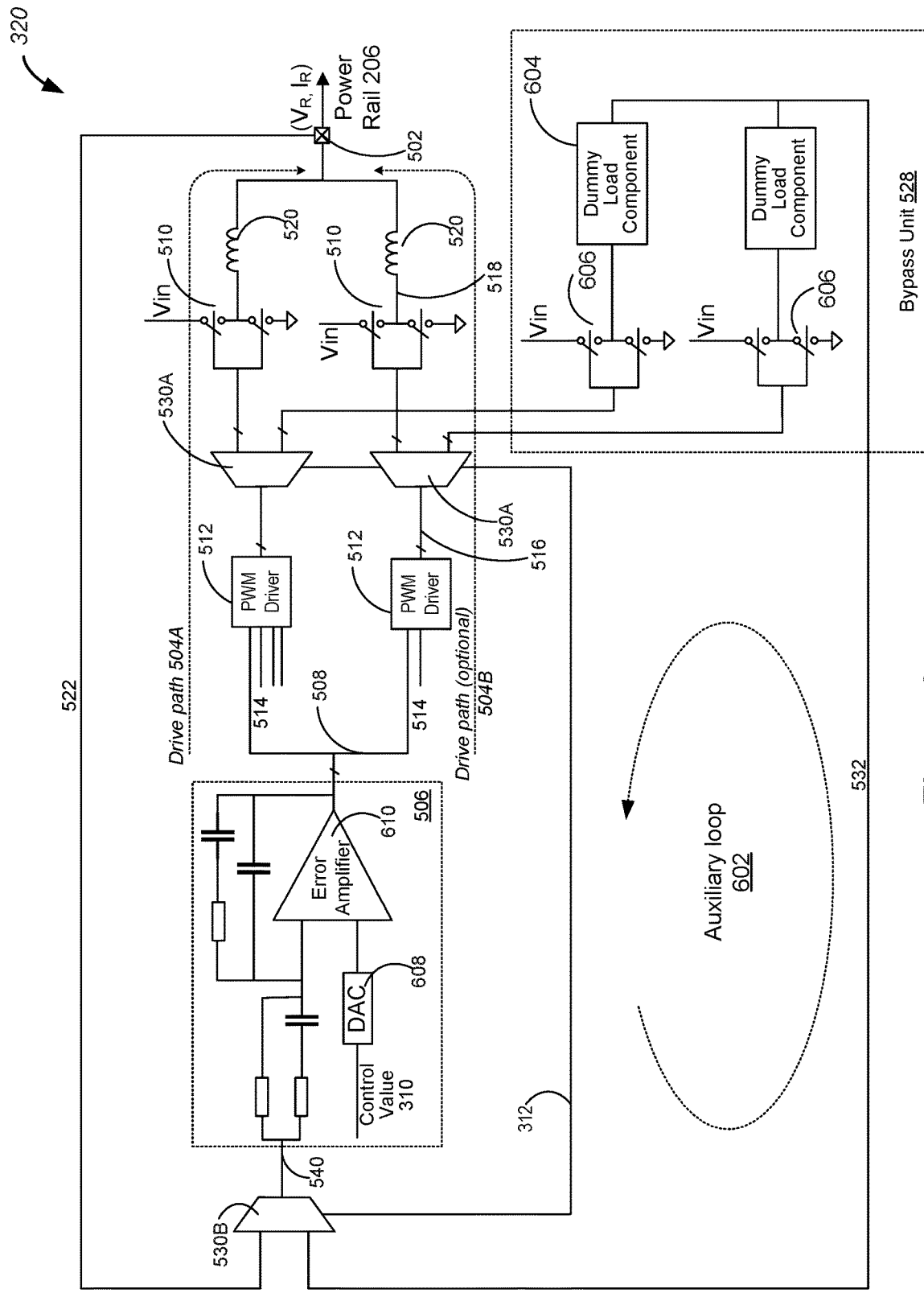
FIG. 6 is a circuit diagram of a voltage regulator having an auxiliary loop to control redundancy, in accordance with some embodiments.

FIG. 6 is a circuit diagram of a voltage regulator 320 having an auxiliary loop 602 to facilitate fast transitions between operation of the voltage regulator in bypass mode and operation of the voltage regulator in operational mode, in accordance with some embodiments. Voltage regulator controller 506 is coupled to, and provides a path control signal 508 to each of drive paths 504A-504B. A feedback path 522 connects an output interface 502 of drive paths 504A-504B to a feedback input 540 of voltage regulator controller 506. In some embodiments, voltage regulator controller 506 includes a digital-to-analog converter (DAC) 608, an error amplifier 610, and amplifier feedback circuit, and is configured to enable pulse width modulation for drive paths 504A-504B. Control value 310 is applied by DAC 608 to generate a reference voltage (e.g., reference voltage 704, FIG. 7) which is received at an input of error amplifier 610. An amplifier feedback circuit and feedback path 522 dynamically control the rail voltage $V_R$ output at output interface 502 to match the reference voltage. Specifically, path control signal 508 is generated by voltage regulator controller 506 to control duty cycles of drive paths 504A-504B to match the rail voltage $V_R$ with the reference voltage. In some situations, power array controller 302 also provides an operation enable signal 312 to each voltage regulator 320 to enable generating the respective rail voltage $V_R$ and the respective rail current $I_R$. In some embodiments, operation enable signal 312 is optionally applied to control (e.g., enable and disable) error amplifier 610 and/or DAC 608, thereby disabling the entire voltage regulator 320 when voltage regulator 320 is a redundant voltage regulator (e.g., 320RA-320RD in FIG. 3) that is not associated with any power rails 206.

As explained above, voltage regulator 320 has a standby mode in which voltage regulator 320 (e.g., 320RA-320RD) is not enabled to power any power rail 206 or in which voltage regulator 320 (e.g., 320H in FIG. 4B) is coupled to a power rail 206, but is temporarily disabled from contributing to a corresponding rail current $I_R$ of power rail 206. In some embodiments, regardless of whether voltage regulator 320 is coupled to any power rail 206, voltage regulator 320 includes one or more drive paths 504 and a bypass unit 528. Voltage regulator controller 506 of voltage regulator 320 has an output 508 coupled to the one or more drive paths 504 and a feedback input 540 coupled to output interface 502 by a feedback path 522. Bypass unit 528 is coupled to the one or more drive paths 504 and voltage regulator controller 506, and configured to provide a dummy load component 604. In the standby mode, when bypass unit 528 is enabled, auxiliary loop 602 is formed, bypassing the feedback path 522 from output interface 502 to the input of voltage regulator controller 506, and driving dummy load component 604 with one or more switching components 606. As such, auxiliary loop 602 includes the bypass unit 528 and is enabled in place of the feedback path 522 in the standby mode to disable voltage regulator 320 from contributing to the corresponding rail current $I_R$ of power rail 206. When the auxiliary loop 602 is enabled, because the voltage regulator 320 is in standby mode, the feedback path 522 is disabled.

Specifically, in the standby mode, bypass unit 528 is enabled to bypass switch component 510 and passive load component 520 of each drive path 504. Each drive path 504 further includes a multiplexer 530A coupled to PWM driver 512, switch component 510 and bypass unit 528. Multiplexer 530A is configured to select bypass unit 528 and deselect switch component 510 and electrically couple PWM driver 512 to bypass unit 528 in the standby mode. Voltage regulator 320 further includes a multiplexer 530B coupled between feedback input 540 of voltage regulator controller 506 and output interface 502. Multiplexer 530B is configured to operate concurrently with multiplexer 530A of each drive path 504 to select bypass unit 538 and deselect output interface 502 for the input to voltage regulator controller 506. In some embodiments, operation enable signal 312 is used to control multiplexer 530A and multiplexer 530B concurrently to enable the standby mode. By these means, in the standby mode, switch component 510 and passive load component 520 of each drive path 504 are skipped by bypass unit 528, while voltage regulator controller 506 and PWM driver 512 of each drive path 504 continue to operate with dummy load component 604 and switching components 606 within bypass unit 528.

In summary, when voltage regulator 320 is in the standby mode, auxiliary loop 602 is formed (or enabled) to decouple output interface 502 without entirely shutting down voltage regulator 320. Voltage regulator controller 506 and PWM drivers 512 of drive paths 504 remain operational in the standby mode, allowing voltage regulator 320 to wake up promptly and maintain a desirable transient response time when it recovers from the standby mode and resumes operation in the operational mode. For example, in some situations, voltage regulator controller 506 and PWM drivers 512 of drive paths 504 enable a prompt switch to the operational mode by maintaining the same operating points (e.g., the rail voltage $V_R$ at feedback input 540) in both the standby mode and the operational mode. Moreover, switching components 510 of drive paths 504 are decoupled and disabled, and dummy load component 604 and switching components 606 are designed to consume less power than switching components 510 and load components 520 of drive paths 504. In an example, a voltage regulator 320 drives a power rail 206 with a rail current of 1.5 A in the operational mode, and consumes less than 100 mA while driving dummy load component 604 and switching components 606 in the standby mode. This efficiently conserves power consumption of voltage regulator 320 in the standby mode.

Conversely, in some embodiments or in some circumstances, a respective voltage regulator 320 (e.g., any of voltage regulators 320RA-320RD in FIG. 3) is not assigned to drive any power rail 206, and may be entirely shut down or operate in the standby mode. In the standby mode, voltage regulator controller 506 and PWM drivers 512 of drive paths 504 are operational, and bypass unit 528 is enabled to bypass switching components 510 and load components 520 of drive paths 504. When coupled to a power rail 206, such a redundant voltage regulator 320 can, upon transition from the standby mode to the operational mode, output a rail voltage $V_R$ and contribute current to the corresponding rail current $I_R$ of the power rail 206 promptly (e.g., with a transient response time). However, if voltage regulator 320 is shut down, voltage regulator controller 506 and PWM drivers 512 of drive paths 504 are disabled under the control of operation enable signal 312. When coupled to a power rail 206, such a redundant voltage regulator 320 has to restart when it transitions from the standby mode to the operational mode before it can contribute to the corresponding rail current $I_R$ of power rail 206. The restart process is oftentimes slow and compromises a relatively long transient response time when the voltage regulator 320 recovers from being entirely shut down, while application of bypass unit 528 with operational voltage regulator controller 506 and PWM drivers 512 allows both prompt mode switching and low power consumption.

Figure 7:
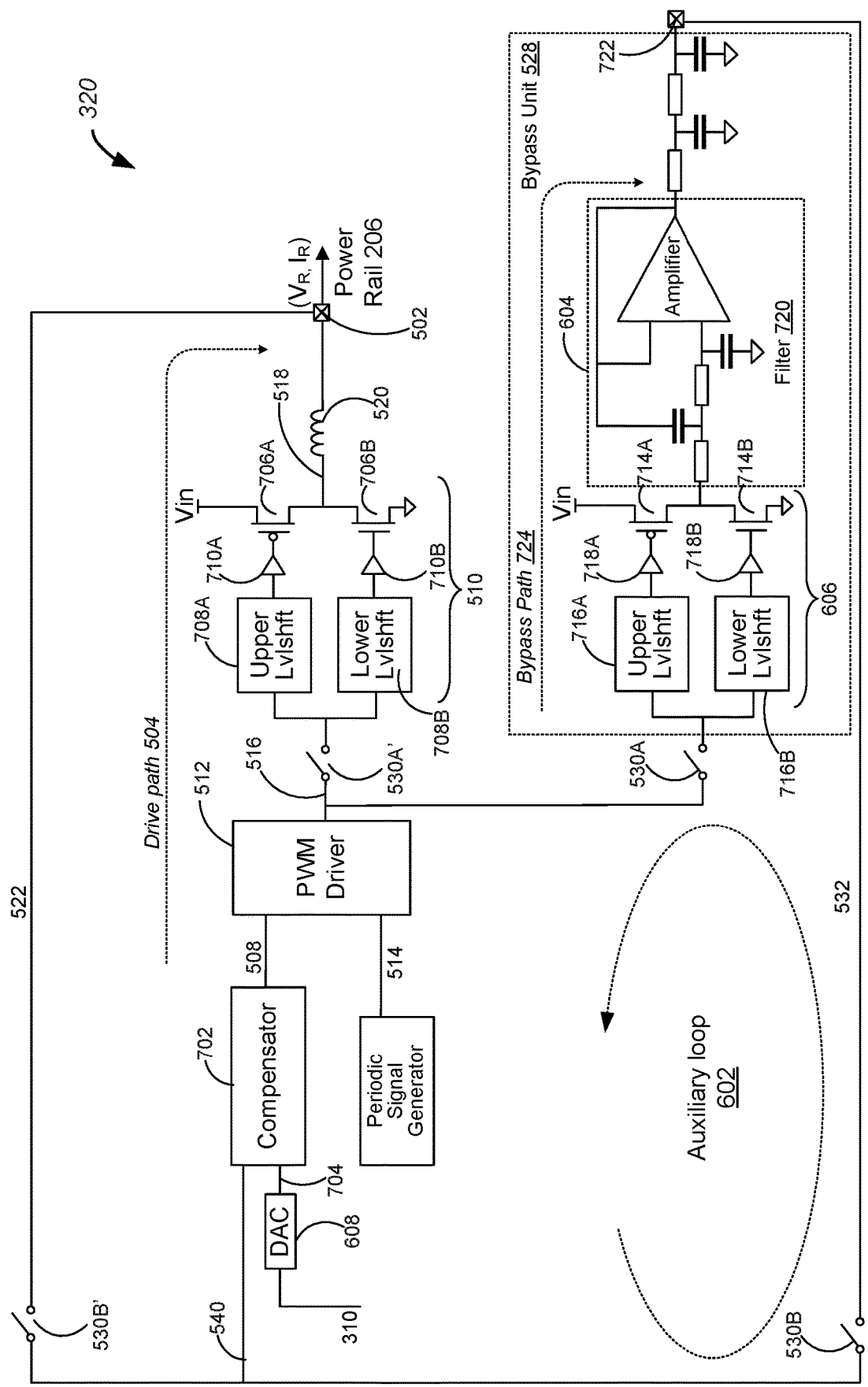
FIG. 7 is a circuit diagram of an example voltage regulator having a filter-based auxiliary loop, in accordance with some embodiments.

FIG. 7 is a circuit diagram of an example voltage regulator 320 having a filter-based auxiliary loop 602, in accordance with some embodiments. A compensator 702 is coupled to, and provides path control signal 508 to a drive path 504. A feedback path 522 connects an output interface 502 of voltage regulator 320 to a feedback input 540 of compensator 702. Compensator 702 is coupled to a DAC 608, and is configured to enable pulse width modulation for drive path 504. Control value 310 is applied by DAC 608 to generate a reference voltage 704, which is received at a reference input of compensator 702. Compensator 702 dynamically controls the rail voltage $V_R$ output at output interface 502 to match reference voltage 704, output by DAC 608. Specifically, path control signal 508 is generated by compensator 702 to control duty cycles of drive path 504 to match the rail voltage $V_R$ and reference voltage 704. In some situations, power array controller 302 also provides an operation enable signal 312 to each voltage regulator 320 to enable generating the respective rail voltage $V_R$ and the respective rail current $I_R$, and the operation enable signal 312 controls switches 530 to enable one of a standby mode and an operational mode for respective voltage regulator 320. In some embodiments, compensator 702 is one of a type II compensator and a type III compensator. In some embodiments, a type III compensator is used, for example for implementations in which a phase margin that exceeds a threshold phase margin is needed to keep both a feedback loop corresponding to feedback path 522 and auxiliary loop 602 stable.

A switch component 510 of drive path 504 includes an upper switching transistor 706A and a lower switching transistor 706B. Upper switching transistor 706A is coupled between DC supply voltage $V_{IN}$ 202 and a passive load component 520, and is controlled by an upper level shifter 708A that receives and converts switching signal 516 generated by PWM driver 512. Lower switching transistor 706B is coupled between a low DC supply voltage (e.g., ground, sometimes called circuit ground) and passive load component 520, and is controlled by a lower level shifter 708B that receives and converts switching signal 516 generated by PWM driver 512.

Voltage regulator 320 further includes a bypass unit 528 coupled to a switch 530A and a switch 530B at an input and an output of the bypass unit 528. A switch 530A' is inserted into, and breaks, an interconnect carrying switching signal 516 in drive path 504, and a switch 530A' is inserted into, and breaks, feedback path 522. Bypass unit 528 is coupled in parallel to switch component 510 and passive load component 520 of drive path 504 via switches 530A, 530A', 530B, and 530B'. Switches 530A and 530A' are optionally two separate switches coupled to each other or integrated in a single-input two-output multiplexer. Switches 530B and 530B' are optionally two separate switches coupled to each other or integrated in a two-input one-output multiplexer. In the standby mode, switches 530A and 530B are enabled and switches 530A' and 530B' are disabled, such that auxiliary path 532 is enabled to bypass feedback path 522 from output interface 502 to the feedback input of compensator 702. Voltage regulator 320 is therefore disabled from contributing to the respective rail current $I_R$ of power rail 206 to which voltage regulator 320 is assigned to drive. In the operational mode, switches 530A' and 530B' are enabled and switches 530A and 530B are disabled, such that auxiliary path 532 is disabled, and switch component 510 and passive load component 520 are enabled to output the rail voltage $V_R$ to power rail 206. Each of switches 530A, 530A', 530B, and 530B' is controlled by operation enable signal 312 or its complementary signal.

Bypass unit 528 includes a bypass switching component 606 having an upper switching transistor 714A and a lower switching transistor 714B. Upper switching transistor 714A is coupled between DC supply voltage $V_{IN}$ 202 and a dummy load component 604, and is controlled by an upper level shifter 716A that receives and converts switching signal 516 generated by PWM driver 512 in the standby mode. Lower switching transistor 714B is coupled between the low DC supply voltage (e.g., ground) and dummy load component 604, and is controlled by a lower level shifter 716B that receives and converts switching signal 516 generated by PWM driver 512 in the standby mode. In some embodiments not shown, dummy load component 604 includes an inductor-capacitor (LC) tank. In some embodiments, dummy load component 604 includes an active filter 720 to mimic an LC tank. The active filter 720 is coupled to a bypass output 722 of bypass unit 528, and includes an operational amplifier and passive feedback components. In an example, active filter 720 is a second order Sallen-Key filter. By these means, an auxiliary loop 602 is established based on a replicated power stage and active filter 720 and enables closed loop control of voltage regulator 320 without engaging the output interface 502 of voltage regulator 320.

In the operational mode, switches 530A and 530B are disabled, and switches 530A' and 530B' are enabled. The control loop control is formed by feedback path 522 from output interface 502 to the feedback input of compensator 702. Compensator 702 generates path control signal 508 to control drive path 504 to generate the rail voltage $V_R$ that powers the power rail 206. Conversely, in the standby mode, path control signal 508 is configured to replicate a power stage, while scaling down the power stage to reduce power consumption. Driven by switching signal 516, active filter 720 can serve the purposes of scaling down the power stage and conserving power consumption. Particularly, given reference voltage 704, output voltages at output interface 502 and bypass output 722 are low pass filtered by compensator 702.

In some embodiments, a bypass voltage output at bypass output 722 of voltage regulator 320 in the standby mode is substantially equal (e.g., within a predefined error margin) to the rail voltage $V_R$ output at output interface 502 of voltage regulator 320 in the operational mode. Alternatively, in some embodiments, the bypass voltage output at bypass output 722 of voltage regulator 320 in the standby mode is not equal to the rail voltage $V_R$, and has a deviation from the rail voltage $V_R$ that is less than a threshold voltage difference. In some embodiments, output interface 502 and bypass output 722 of voltage regulator 320 are disposed physically proximate to each other on PMIC die 118. By these means, when the standby mode is changed to the operational mode, voltage regulator 320 can provide the predefined regulator current $I_R$ and the rail voltage $V_R$ to the power rail 206 within a predefined period of time (e.g., within 10 microseconds).

Referring to FIG. 7, in some embodiments, voltage regulator 320 includes only one drive path 504, and bypass unit 528 includes only one bypass path 724 configured to bypass part of the one drive path 504 of voltage regulator 320 in the standby mode. Alternatively, in some embodiments, voltage regulator 320 includes a plurality of drive paths 504, and bypass unit 528 includes a plurality of bypass paths 724 configured to bypass the plurality of drive paths 504 of voltage regulator 320. Bypass paths 724 has the same number of paths as, or a distinct number of paths from, drive paths 504. Additionally and alternatively, in some embodiments, voltage regulator 320 includes a plurality of drive paths 504, and bypass unit 528 includes only one bypass path 724 configured to bypass the plurality of drive paths 504 of voltage regulator 320 in the standby mode.

Figure 8:
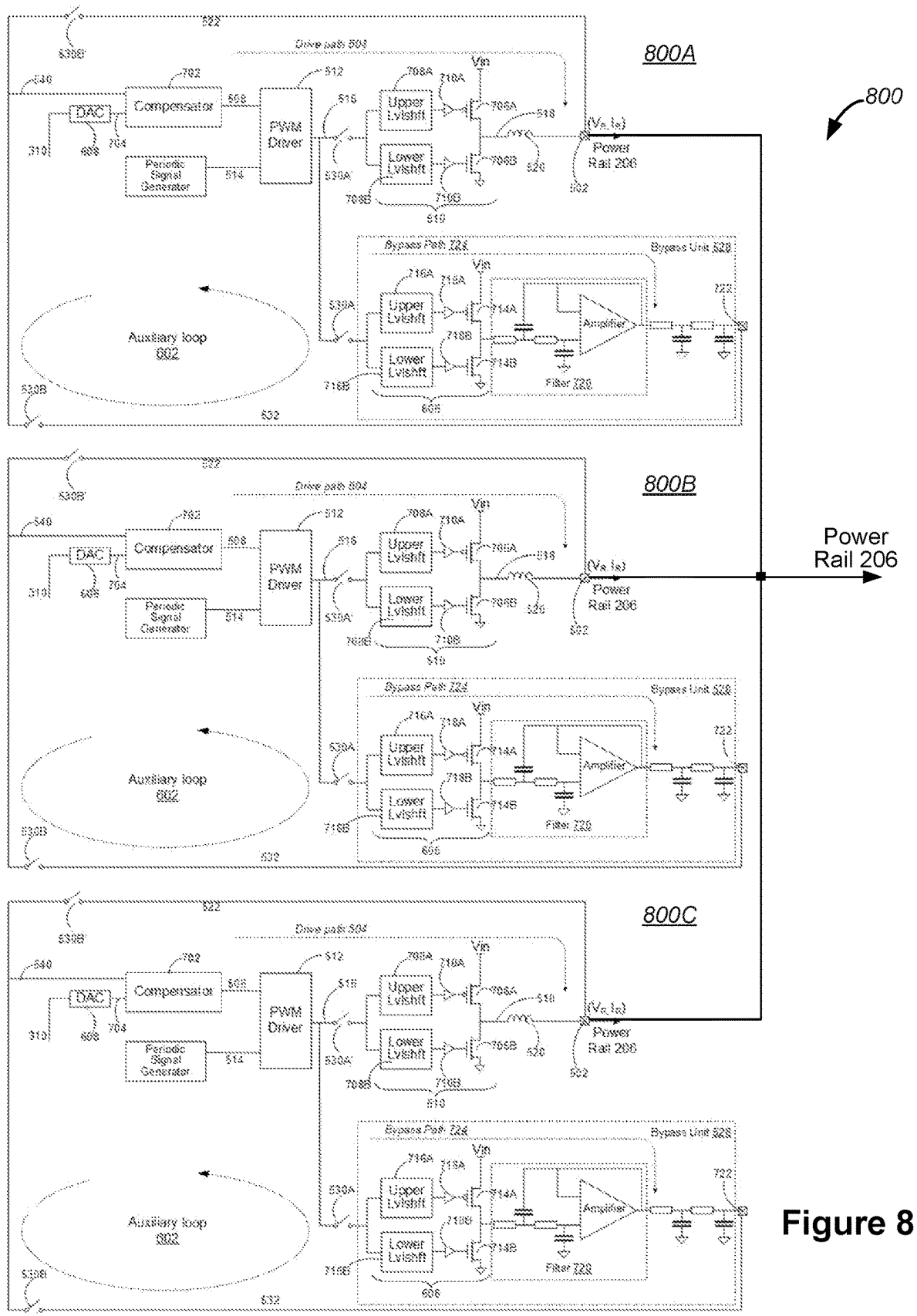
FIG. 8 is a circuit diagram of a plurality of voltage regulators, of a field programmable array of voltage regulators, configured to drive a power rail, in accordance with some embodiments.

FIG. 8 is a circuit diagram of a plurality of voltage regulators 800 of a field programmable array of voltage regulators configured to drive a power rail 206, in accordance with some embodiments. The plurality of voltage regulators 800 include a first voltage regulator 800A, a second voltage regulator 800B, and a third voltage regulator 800C. Voltage regulators 800A-800C are identical to each other. In this example, each voltage regulator 800 has the same circuit configuration as voltage regulator 320 discussed above with reference to FIG. 7. Specifically, each voltage regulator 800 includes a compensator 702 coupled to a drive path 504 and a bypass path 724. Compensator 702 provides path control signal 508 to a drive path 504. A feedback path 522 connects an output interface 502 coupled to drive path 504 to a feedback input 540 of compensator 702. A reference input of compensator 702 is coupled to a DAC 608, and is configured to receive a reference voltage 704 generated by the DAC 608 according to control value 310. Compensator 702 dynamically controls the rail voltage $V_R$ output at output interface 502 to match reference voltage 704 by way of enabling pulse width modulation for drive path 504. Specifically, a path control signal 508 is generated by compensator 702 to control duty cycles of drive path 504 to match the rail voltage $V_R$ and reference voltage 704. Bypass unit 528 is coupled on bypass path 724, and switches 530 are applied to couple bypass unit 528 in parallel with PWM driver 512 and compensator 702, thereby allowing part of drive path 504 including output interface 502 that is coupled to power rail 206 to be bypassed in a standby mode.

Output interfaces 502 of voltage regulators 800A-800C are electrically coupled to the same power rail 206. However, each of voltage regulators 800A-800C is independently controlled to drive power rail 206 by a distinct corresponding operation enable signal 312. In each voltage regulator 800, the operation enable signal 312 for that voltage regulator controls switches 530 to selectively enable only one of feedback path 522 and auxiliary path 532. Further, voltage regulators 800A-800C share the same DC supply voltage $V_{IN}$ 202 and low DC supply voltage (e.g., ground) coupled to switch component 510 and bypass switching component 606. In some embodiments, control values 310 of voltage regulators 800A-800C are identical to each other, such that PWM drivers 512 of voltage regulators 800A-800C generate switching signals 516 having the same duty cycles in different voltage regulators 800A-800C. Alternatively, in some embodiments, control values 310 of voltage regulators 800A-800C are independently controlled with operation enable signals 312 of voltage regulators 800A-800C.

In some situations, each of the first and second voltage regulators 800A and 800B operates to drive power rail 206 in the operational mode. Feedback paths 522 of respective voltage regulators 800A and 800B are enabled between output interface 502 and feedback input 540 of those respective voltage regulators 800A and 800B in the operational mode. Conversely, third voltage regulator 800C is electrically decoupled from power rail 206 in the standby mode in which bypass unit 528 of third voltage regulator 800C is enabled to bypass feedback path 522 of third voltage regulator 800C.

Alternatively, in some situations, each of the first and second voltage regulators 800A and 800B operates in the standby mode, and bypass unit 528 of respective voltage regulators 800A and 800B is enabled to bypass feedback path 522 between output interface 502 and feedback input 540 of the respective voltage regulators 800A and 800B. Conversely, third voltage regulator 800C operates in the operational mode in which feedback path 522 of voltage regulator 800C is enabled between output interface 502 and feedback input 540 of voltage regulator 800C in the operational mode. Alternatively and additionally, in some situations, all three voltage regulators 800A-880C operate in the operational mode in which feedback path 522 of each and every voltage regulator 800A-800C is enabled between output interface 502 and feedback input 540 of the respective voltage regulators 800A-800C.

Referring to FIG. 8, the plurality of voltage regulators 800 are configured to drive a power rail 206 in a configurable manner. In some embodiments, each voltage regulator 800 is trimmed to minimize relative mismatches (e.g., offset error, gain error, and/or bandwidth error) with the other voltage regulators 800. In-situ and in-parallel trimming mechanisms are optionally applied to SoC 102 and PMIC 118, which are fully integrated or assembled as shown in FIG. 1B. During in-situ and in-parallel trimming, each voltage regulator 800 enables a respective auxiliary loop 602 an disables a respective feedback path 522. By these means, a gain and offset errors of each voltage regulator 800 is adjusted without causing power sequence issues.

Under some circumstances, the plurality of voltage regulators 800 are powered up. When DC supply voltages (e.g., voltage 202) are initially applied, voltage differences among the rail voltages $V_R$ output by feedback-based voltage regulators 800 are large, causing voltage regulators 800 to counteract with each other and slow down a powerup process of the voltage regulators 800. This is not desirable for a quick power state transition. To avoid this condition, in some embodiments the voltage regulators 800 coupled to the same power rail are preconditioned with analog signal levels before being coupled to the power rail 206. Specifically, in some situations, output interfaces 502 of voltage regulators 800 are electrically decoupled from power rail 206, when the DC supply voltages are initially applied. The standby mode and operational mode are applied sequentially during the powerup process of each voltage regulator 800. Auxiliary loop 602 of each voltage regulator 800 is initially enabled during a power up operation, until the respective voltage regulator 800 is stabilized to output the rail voltage $V_R$ at bypass output 722, and feedback path 522 is subsequently enabled to couple the respective voltage regulator 800 to power rail 206.

Alternatively, during a power up operation, each voltage regulator 800 starts in the operational mode. An output voltage at output interface 502 of each voltage regulator 800 is monitored and compared with a threshold start voltage. For each voltage regulator 800, in accordance with a determination that the output voltage exceeds the threshold start voltage, output interface 502 of the voltage regulator 800 is electrically coupled to power rail 206. More specifically, in an example, the threshold start voltage is 1 V, and the rail voltage $V_R$ is 1.8 V. Voltage regulators 800A-800C are each powered up separately to avoid inter-regulator counteraction. In accordance with a determination, separately for each voltage regulator 800A-800C, that the output voltage reaches 1 V at output interface 502 of that voltage regulator (e.g., 800A), output interface 502 of that voltage regulator (e.g., 800A) is electrically coupled to power rail 206, e.g., using a switch coupled between output interface 502 of the voltage regulator (e.g., 800A) and power rail 206.

During a power-on test, a normal loop of each voltage regulator 800 on PMIC 118 operates to ramp up the rail voltage $V_R$ for driving SoC 102. In some situations, one of SoC 102 and PMIC 118 may fail and cause a hardware fault condition to occur. For in-field fault diagnosis, a defect location needs to be identified from among SoC 102 and the different voltage regulators 800 of PMIC 118. Therefore, each of SoC 102 and voltage regulators 800 can be isolated and monitored separately, i.e., each SoC 102 or voltage regulator 800 can operate separately from any other SoC 102 or voltage regulator 800. In an example, each voltage regulator 800 is decoupled from SoC 102 or other voltage regulator(s) 800 by entering the standby mode in which bypass unit 528 is enabled to bypass feedback path 522 from output interface 502 to feedback input 540 of compensator 702.

Figure 9A:
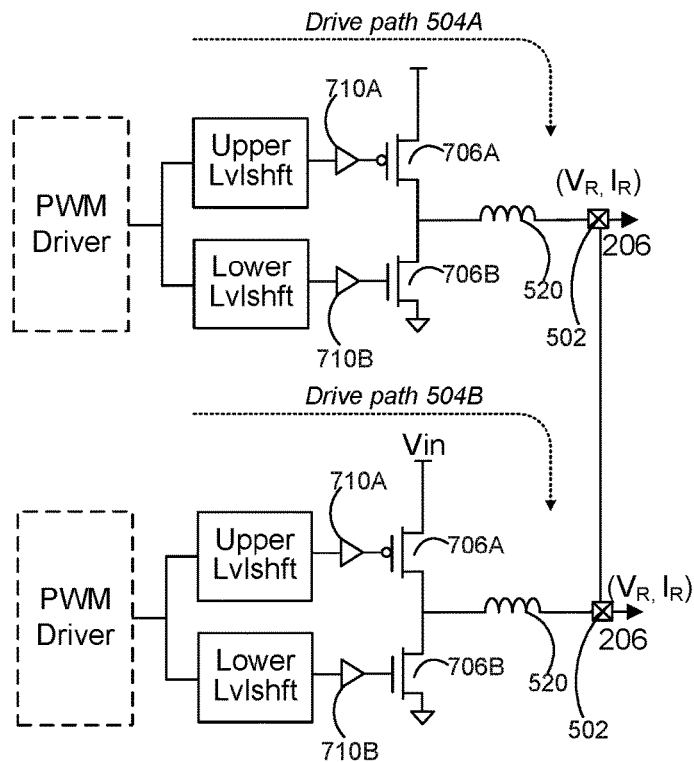
FIG. 9A is a circuit diagram of a multi-phase driver in a voltage regulator having a plurality of drive paths while operating in an operational mode, in accordance with some embodiments.
Figure 9B:
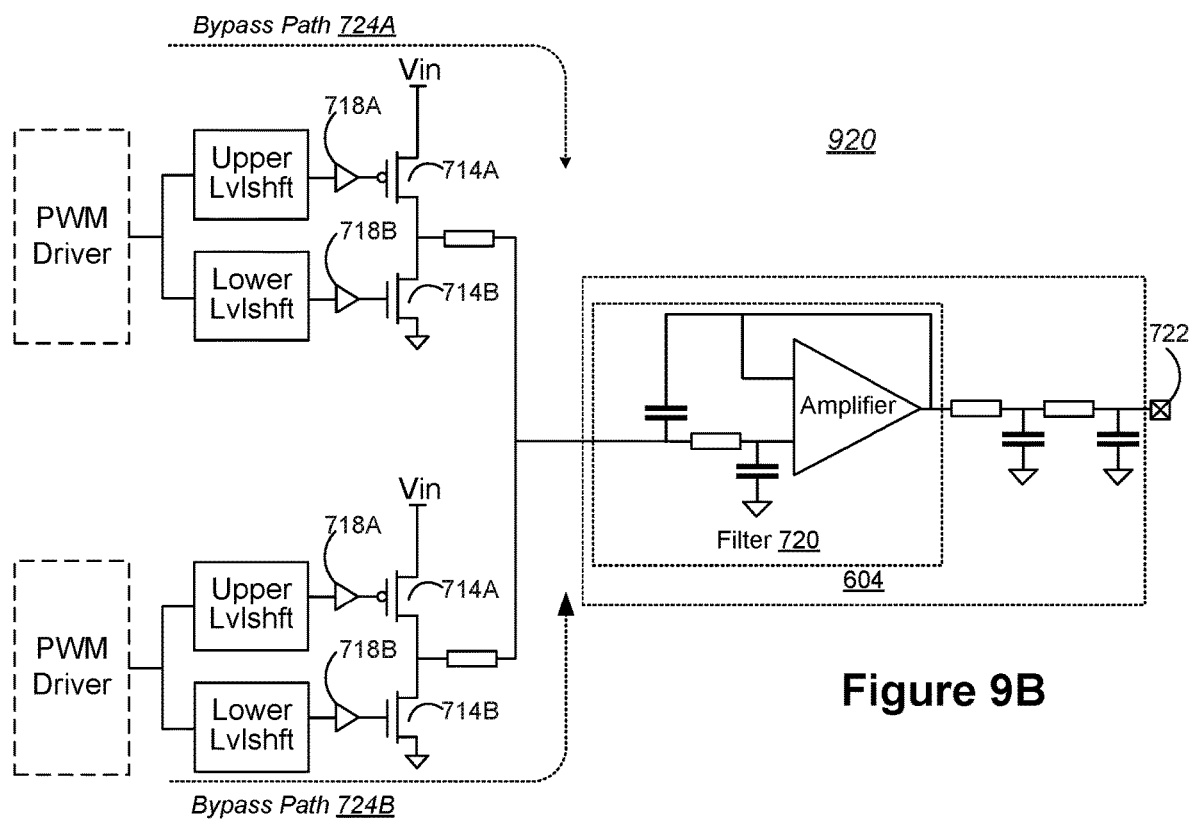
FIG. 9B is a circuit diagram of a voltage regulator having a plurality of bypass paths while operating in a bypass mode, in accordance with some embodiments.

FIG. 9A is a circuit diagram of a portion 900, herein called multi-phase drive part 900, of a voltage regulator 320 having a plurality of drive paths 504, in accordance with some embodiments, and FIG. 9B is a circuit diagram of another portion 920, herein called multi-phase bypass part 920, of a voltage regulator 320 having a plurality of bypass paths 724, in accordance with some embodiments. Drive part 900 corresponds to portions of two parallel drive paths 504A and 504B, and bypass part 920 corresponds to two parallel bypass paths 724A and 724B. The portion of each drive path 504A or 504B of drive part 900 and a respective bypass path 724 of bypass part 920 are coupled in parallel to each other via switches 530. Referring to FIG. 5B, switches 530 select either (e.g., one of) drive part 900 or bypass part 920 to be electrically coupled to PWM drivers 512 and feedback input 540 of voltage regulator controller 506. In addition to drive paths 504, drive part 900 further includes an output interface 502 to which each drive path 504 is coupled. As shown in a full voltage regulator schematic (e.g., in FIG. 6), output interface 502 is coupled to feedback input 540 of voltage regulator controller 506. Output interface 502 is also coupled to a power rail 206 and configured to provide a rail voltage $V_R$ generated by voltage regulator 320 and deliver up to a predefined regulator current to power rail 206.

Each drive path 504 (e.g., 504A or 504B) includes a switch component 510 (as shown in FIG. 6), a passive load component 520, and a PWM driver 512, and is arranged in parallel with other drive path(s) 504 in the same voltage regulator 320. Each drive path 504 is configured to operate during a respective phase and with an operating frequency to provide a respective path current $I_P$ to power rail 206. The respective path current $I_P$ becomes a portion of the rail current $I_R$ injected to power rail 206. Drive part 900 (FIG. 9A) includes a first number of drive paths 504, and bypass part 920 (FIG. 9B) has a second number of bypass paths 724. Optionally, the second number is equal to the first number, such that each bypass path 724 is configured to bypass switch component 510 and passive load component 520 of a respective single drive path 504. The same PWM driver 512 driving a respective single drive path 504 in an operational mode is configured to drive a corresponding bypass path 724 in a standby mode. As such, in the standby mode, each bypass path 724 is configured to operate during the respective phase and with the operating frequency, and different bypass paths 724 optionally have different phases under the control of different PWM drivers 512.

In some embodiments, bypass part 920 acts as a bypass unit 528 of voltage regulator 320 (e.g., in FIG. 5B). In some embodiments, bypass part 920 includes a plurality of bypass switching components (e.g., components 606 in FIG. 6, or components 714A and 714B in FIGS. 9B and 9D) and a single dummy load component 604, coupled between the plurality of bypass switching components 606 and a bypass output 722 of bypass unit 528. In this example, dummy load component 604 includes an active filter 720 (e.g., a second-order Sallen-Key filter), and the plurality of bypass paths 724 of bypass unit 528 share the same active filter 720. From this perspective, active filter 720 acts a summing filter with multiple inputs from parallel bypass switching components 606. Conversely, in some embodiments not shown in FIGS. 9B and 9D, bypass unit 528 has the plurality of bypass paths 724, and each bypass path 724 has a distinct bypass switch component 606 coupled to a distinct active filter 720. Bypass outputs 722 of different active filters 720 are optionally coupled to or separate from each other.

Each bypass switching component 606 corresponds to a respective drive path 504, and is configured to bypass part of the corresponding respective drive path 504 in the standby mode. Specifically, a switch component 510 of drive path 504 includes an upper switching transistor 706A configured to create a current path to DC supply voltage $V_{IN}$ 202 and a lower switching transistor 706B configured to create a current path to the low DC supply voltage (e.g., ground). Bypass switching component 606 of bypass path 724 also has an upper switching transistor 714A configured to create a current path to DC supply voltage $V_{IN}$ 202 and a lower switching transistor 714B configured to create the low DC supply voltage (e.g., ground). In some embodiments, upper switching transistor 714A of bypass path 724 has a smaller transistor size than upper switching transistor 706A of drive path 504, and lower switching transistor 714B of bypass path 724 has a smaller transistor size than lower switching transistor 706B of drive path 504.

Figure 9C:
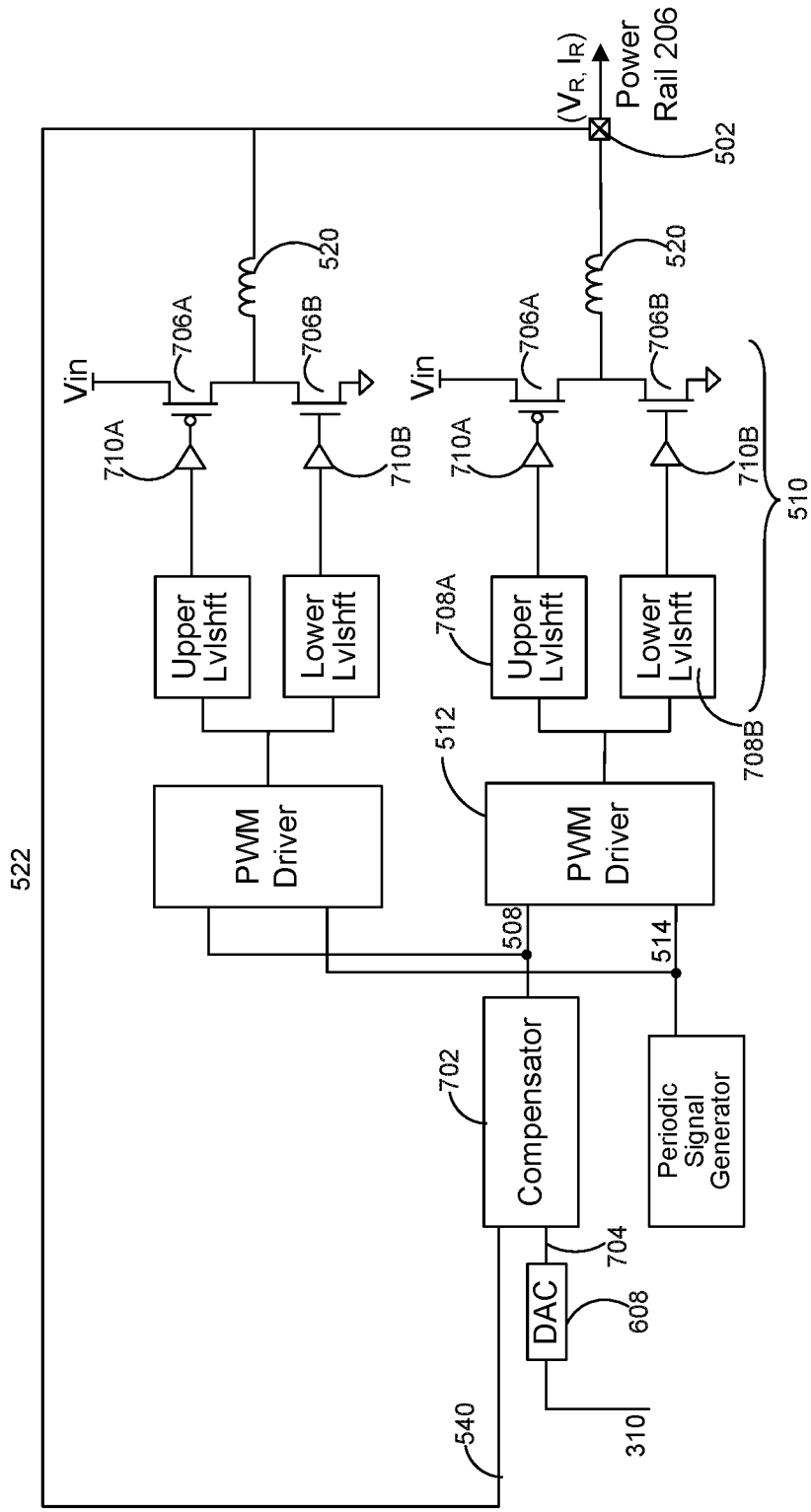
FIGS. 9C and 9D are circuit diagrams of equivalent circuits of a voltage regulator that operates in an operational mode and a bypass mode, respectively, in accordance with some embodiments.
Figure 9D:
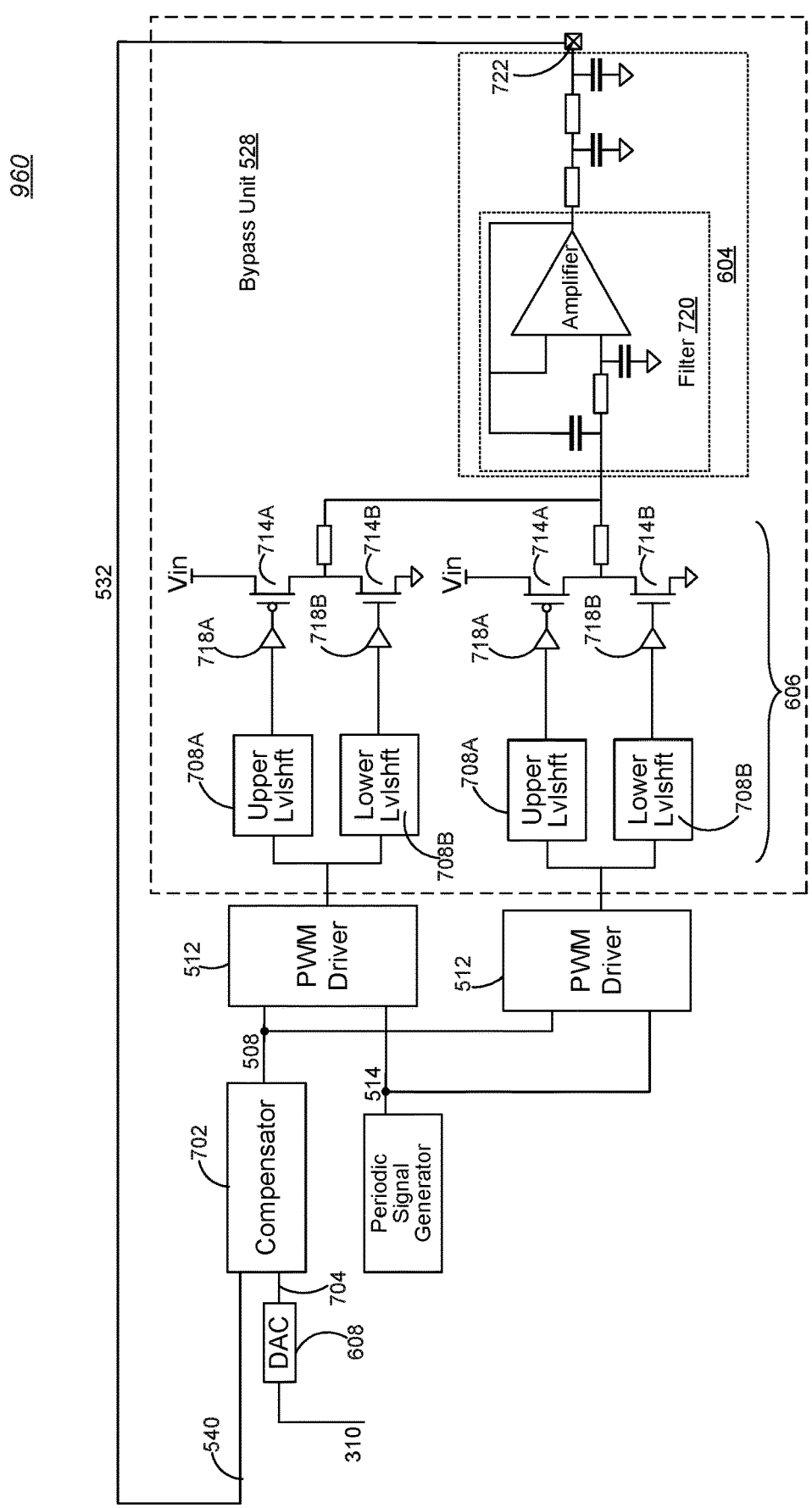

FIGS. 9C and 9D are a circuit diagram of equivalent circuits 940 and 960 of a voltage regulator 320 that operates in an operational mode and a bypass mode, in accordance with some embodiments, respectively. Voltage regulator 320 is a two-phase buck converter. In the standby mode (FIG. 9D), bypass unit 528 is enabled to bypass feedback path 522 from output interface 502 to feedback input 540 of voltage regulator controller 506 (specifically, compensator 702 therein), and voltage regulator 320 does not deliver current to power rail 206. Voltage regulator 320 has a first alternating current (AC) loop response in the standby mode. The first AC loop response has a first low frequency gain, a first cutoff frequency, and a first phase margin. In an operational mode (FIG. 9C), bypass unit 528 is disabled from bypassing feedback path 522, and voltage regulator 320 delivers up to a predefined regulator current to power rail 206. Voltage regulator 320 has a second AC loop response in the operational mode. The second AC loop response has a second low frequency gain, a second cutoff frequency, and a second phase margin. The first and second low frequency gains are substantially equal to each other, e.g., have a first gain difference less than a first threshold. The first and second cutoff frequencies are substantially equal to each other, e.g., have a second frequency difference that is less than a second threshold (such as 5 kHz). The first and second phase margins are substantially equal to each other, e.g., have a third phase margin difference that is less than a third threshold (such as 5°).

Voltage regulator 320 applies active filter 720 in bypass unit 528. Active filter 720 provides an LC filter frequency response with a sufficient quality factor (e.g., greater than a quality factor threshold). In the standby mode, auxiliary loop 602 is stabilized based on a phase margin and a gain margin. The phase margin is greater than a phase margin threshold, and the gain margin is greater than a gain margin threshold. Active filter 720 includes an operational amplifier 902 having sufficient drive capability for a large load (e.g., a load greater than a threshold load). Additionally, in the operational mode, bypass output 722 is decoupled from power rail 206, and therefore does not disturb operation of SoC 102 coupled to power rail 206.

In some embodiments (e.g., in FIG. 9C), bypass unit 528 having one or more bypass paths 724 is applied to bypass feedback path 522 in a buck converter. It is noted that, in some embodiments, bypass unit 528 having one or more bypass paths 724 is similarly applied to bypass feedback path 522 in a boost converter or a buck-boost converter.

FIG. 10 is a flow diagram of a method 1000 for driving a power rail 206 of an electronic device, in accordance with some embodiments. In some embodiments, the electronic device includes an integrated semiconductor device 180 integrating an SoC 102 and PMIC 118 in a vertical manner. In some embodiments, the electronic device includes an SoC 102 and PMIC 118 that are mounted on a circuit board. Power rail 206 is provided by PMIC 118 to drive operation of SoC 102. The electronic device has a plurality of voltage regulators 320 electrically coupled to power rail 206 and configured to provide a rail voltage $V_R$ and a rail current $I_R$ to one of the power rails 206.

The electronic device generates and provides (1002) the rail voltage $V_R$ and the rail current $I_R$ to power rail 206. Each respective voltage regulator 320 has (1004) an output interface coupled to the power rail 206 and is configured to provide the rail voltage $V_R$ and deliver up to a predefined regulator current to power rail 206 when respective voltage regulator 320 is in an operational mode. The electronic device obtains (1006) a control setting for each respective voltage regulator 320 of the plurality of voltage regulators. The control setting for each respective voltage regulator 320 determines (1008) whether respective voltage regulator 320 is a standby voltage regulator operating in a standby mode or is an operational voltage regulator operating in the operational mode. Each standby voltage regulator 320 (e.g., regulator 800C in FIG. 8) enables (1010) a bypass unit 528 of the standby voltage regulator to bypass a feedback path 522 from the output interface 502 to an input 540 of a voltage regulator controller 506, such that the standby voltage regulator 320 does not deliver current to power rail 206. Each operational voltage regulator 320 (e.g., regulator 800A or 800B in FIG. 8) disables (1012) bypass unit 528 from bypassing feedback path 522, such that the respective voltage regulator 320 delivers current to power rail 206.

In some embodiments, each respective voltage regulator 320 of the plurality of voltage regulators is configured to transition, in accordance with a change in the control setting, from the standby mode to the operational mode, and to provide the predefined regulator current to power rail 206 within a predefined period of time (e.g., within 1, 2, 5, or 10 microseconds). That said, in some situations, the predefined period is in the range of 0.1 to 10 microseconds. Given that each voltage regulator 320 is not entirely shut down in the standby mode, a respective voltage regulator 320 can promptly switch from the standby mode to the operational mode to provide the predefined regulator current to power rail 206.

In some embodiments, for each respective voltage regulator 320, the control setting includes a control value 310 and an operation enable signal 312. Control value 310 defines a magnitude of the rail voltage $V_R$, and operation enable signal 312 is configured to control respective voltage regulator 320 to operate in either the standby mode, in which bypass unit 528 is enabled to bypass feedback path 522, or the operational mode, in which bypass unit 528 is disabled from bypassing feedback path 522, thereby controlling total current injected to power rail 206 in association with the rail voltage $V_R$. Specifically, operational enable signal 312 is applied to control switches 530 to select one of bypass unit 528 and feedback path 522 to be electrically coupled to voltage regulator controller 506 and PWM driver 512.

In some embodiments, each respective voltage regulator 320 includes one or more drive paths 504 coupled to output interface 502 and is configured to operate with an operating frequency. Voltage regulator controller 506 of the respective voltage regulator 320 has an output 508 coupled to one or more drive paths 504 and an input 540 coupled to the output interface 502 by feedback path 522. Voltage regulator controller 506 is configured to control the one or more drive paths 504 and the bypass unit 528.

In some embodiments, the electronic device determines (1014) the control setting for each respective voltage regulator 320 coupled the power rail 206 dynamically and in real time based on a load condition and a power state policy associated with power rail 206.

In some embodiments, referring to FIG. 5B, each voltage regulator includes one or more drive paths 504 coupled to output interface 502 and voltage regulator controller 506. Each drive path 504 further includes a passive load component 520 coupled to output interface 502, a driver 512 configured to receive a periodic signal 514 having an operating frequency and modulate the periodic signal 514 to provide a switching signal 516 with a distinct phase, and a power switch component 510 coupled to driver 512 and passive load component 520. Power switch component 510 is configured to couple passive load component 520 to one or more DC supply voltages $V_{IN}$ under the control of switching signal 516. Further, in some embodiments, in the standby mode, bypass unit 528 is enabled to bypass power switch component 510 and passive load component 520 of each drive path 504, and each drive path 504 further includes a first multiplexer 530A coupled to driver 512, power switch component 510 and bypass unit 528. First multiplexer 530A is configured to be controlled by the control setting (specifically, operation enable signal 312) to enable the standby mode, i.e., to select an access to bypass unit 528 and deselect an access to power switch component 510 to be electrically coupled to driver 512 of drive path 504. Additionally, each voltage regulator 320 further includes a second multiplexer 530B coupled to input 540 of voltage regulator controller 506, output interface 502 of power rail 206, and a bypass output 722 of bypass unit 528. Second multiplexer 530B is configured to be controlled by the control setting (specifically, operation enable signal 312), concurrently with first multiplexer 530A, to enable the standby mode, i.e., to select bypass output 722 of bypass unit 528 and deselect output interface 502 of power rail 206 to be coupled to input 540 of voltage regulator controller 506.

In some embodiments, referring to FIGS. 6 and 7, bypass unit 538 includes one or more bypass paths 724, and each bypass path 724 includes a respective bypass switching component 606 having a bypass switching transistor 714 of a first size. Switch component 510 of each driver path 504 has a path switching transistor 706 having a second size. The second size of path switching transistor 706 is greater than the first size of bypass switching transistor 714.

In some embodiments, the plurality of voltage regulators 320 are electrically coupled to a power array controller 506. Power array controller 506 is configured to determine the control setting for each voltage regulator 320 coupled to power rail 206. Further, in some embodiments, for each voltage regulator 320, the control setting is adjusted by power array controller 506 dynamically and in real time based on a load condition and a power state policy associated with power rail 206. For example, the power state policy requires that the control setting maximize a power conversion efficiency of the plurality of voltage regulators or that a quality factor of voltage regulators 320 be greater than a quality factor threshold.

In various embodiments of this application, PMIC has a field programmable array of voltage regulators that are configured to provide rail voltages to a plurality of power rails. Each power rail is associated with a plurality of identical voltage regulators in the field programmable array, while in some embodiments, the field programmable array further includes one or more redundant voltage regulators that are not used to drive any power rail. For each power rail, all of the identical voltage regulators are coupled to drive the respective power rail to provide the maximum drive capability in some situations, while a subset of standby voltage regulators may be decoupled from the respective power rail during standby durations of time in some other situations. During the standby durations of time, a standby mode is enabled to convert a voltage regulator driving a power rail in an operational mode to a redundant or standby voltage regulator. In this standby mode, a bypass unit of a voltage regulator is enabled to bypass a feedback path from an output interface to an input of a voltage regulator controller and the voltage regulator does not deliver current to the corresponding power rail. The voltage regulator is not entirely shut down in the standby mode and can transition to the operational mode to provide a predefined regulator current to the power rail promptly (e.g., within a few microseconds).

Implementation examples are described in at least the following numbered clauses:

Clause 1: An electronic device, comprising: a power rail configured to provide a rail voltage; a plurality of voltage regulators electrically coupled to the power rail and configured to provide the rail voltage collectively, each of the plurality of voltage regulators including: an output interface coupled to the power rail and configured to provide the rail voltage and deliver up to a predefined regulator current to the power rail; one or more drive paths coupled to the output interface and configured to operate with an operating frequency; a voltage regulator controller having an output coupled to the one or more drive paths and an input coupled to the output interface by a feedback path, and configured to control the one or more drive paths; and a bypass unit coupled to the one or more drive paths and the voltage regulator controller; wherein each respective voltage regulator of the plurality of voltage regulators is configured to operate, in accordance with a control setting, in either a standby mode in which the bypass unit is enabled to bypass the feedback path from the output interface to the input of the voltage regulator controller and the respective voltage regulator does not deliver current to the power rail, or an operational mode in which the bypass unit is disabled from bypassing the feedback path and the respective voltage regulator delivers up to the predefined regulator current to the power rail.

Clause 2: The electronic device of clause 1, wherein each respective voltage regulator of the plurality of voltage regulators is configured to transition, in accordance with a change in the control setting, from the standby mode to the operational mode, and to provide the predefined regulator current to the power rail within a predefined period of time.

Clause 3: The electronic device of clause 1, wherein for each respective voltage regulator, the control setting includes a control value and an operation enable signal, the control value defining a magnitude of the rail voltage, the operation enable signal configured to control the respective voltage regulator to operate in either the standby mode in which the bypass unit is enabled to bypass the feedback path or the operational mode in which the bypass unit is disabled from bypassing the feedback path.

Clause 4: The electronic device of clause 1, wherein each of the one or more drive paths further comprises: a passive load component coupled to the output interface; a driver configured to receive a periodic signal having an operating frequency and modulate the periodic signal to provide a switching signal with a distinct phase; and a power switching component coupled to the driver and the passive load component, the power switching component configured to couple the passive load component to one or more DC supply voltages under the control of the switching signal.

Clause 5: The electronic device of clause 4, wherein in the standby mode, the bypass unit is enabled to bypass the power switching component and the passive load component of each drive path, and each of the one or more drive paths further comprises: a first multiplexer coupled to the driver, the power switching component and the bypass unit, wherein the first multiplexer is configured to be controlled by the control setting to enable the standby mode in which the first multiplexer selects an access to the bypass unit and deselects an access to the power switching component to be electrically coupled to the driver of the drive path.

Clause 6: The electronic device of clause 5, each respective voltage regulator further comprising: a second multiplexer coupled to the input of the voltage regulator controller, the output interface of the power rail, and an output of the bypass unit, wherein the second multiplexer is configured to be controlled by the control setting, concurrently with the first multiplexer, to enable the standby mode in which the second multiplexer selects the output of the bypass unit and deselects the output interface of the power rail to be coupled to the input of the voltage regulator controller.

Clause 7: The electronic device of clause 4, wherein: the bypass unit includes one or more bypass paths, each bypass path including a respective bypass switching component having a bypass switching transistor of a first size; the power switching component of each driver path has a path switching transistor having a second size; and the second size of the path switching transistor is greater than the first size of the bypass switching transistor.

Clause 8: The electronic device of any of clauses 1-7, wherein the plurality of voltage regulators are electrically coupled to a power array controller, and the power array controller is configured to determine the control setting for each voltage regulator coupled to the power rail.

Clause 9: The electronic device of clause 8, wherein for each voltage regulator, the control setting is adjusted by the power array controller dynamically and in real time based on a load condition and a power state policy associated with the power rail.

Clause 10: The electronic device of any of clauses 1-6, wherein the bypass unit includes one or more bypass paths, each bypass path having a respective bypass switching component and a respective dummy load component that is coupled between the bypass switching component and an output of the bypass unit, each bypass path configured to bypass a respective drive path of the feedback path in the standby mode.

Clause 11: The electronic device of clause 10, wherein for each bypass path, the respective dummy load component includes an active filter.

Clause 12: The electronic device of clause 11, wherein the active filter is a second order Sallen-Key filter.

Clause 13: The electronic device of any of clauses 1-12, wherein for each respective voltage regulator, the bypass unit is electrically decoupled from the power rail in the standby mode, and configured to output the rail voltage and provide the rail voltage to the input of the voltage regulator controller in the standby mode, such that when the standby mode is changed to the operational mode, the respective voltage regulator can provide the predefined regulator current to the power rail within a predefined period of time.

Clause 14: The electronic device of clause 1, wherein: the bypass unit includes one or more bypass switching components and a dummy load component that is coupled between the one or more bypass switching components and an output of the bypass unit; and each bypass switching component is coupled to a respective drive path in the standby mode.

Clause 15: The electronic device of clause 14, wherein the dummy load component includes one of an active filter, and the active filter is a Sallen-Key filter.

Clause 16: The electronic device of any of clauses 1-15, wherein: the plurality of voltage regulators include a first voltage regulator, a second voltage regulator, and a third voltage regulator; each of the first and second voltage regulators operates to drive the power rail in the operational mode, and the feedback path of the respective voltage regulator is enabled between the output interface and the input of the respective voltage regulator in the operational mode; the third voltage regulator is electrically decoupled from the power rail in the standby mode in which the bypass unit of the third voltage regulator is enabled to bypass the feedback path of the third voltage regulator.

Clause 17: The electronic device of any of clauses 1-16, wherein the plurality of voltage regulators coupled to the power rail are identical to each other.

Clause 18: The electronic device of any of clauses 1-17, wherein: each voltage regulator has a first alternating current (AC) loop response in the standby mode, the first AC loop response having a first low frequency gain, a first cutoff frequency and a first phase margin; each voltage regulator has a second AC loop response in the operational mode, the second AC loop response having a second low frequency gain, a second cutoff frequency and a second phase margin;

a first difference between the first and second low frequency gains is less than a first threshold; a second difference between the first and second cutoff frequencies is less than a second threshold; and a third difference between the first and second phase margin is less than a third threshold.

Clause 19: A method for driving a power rail, further comprising: at an electronic device having a plurality of voltage regulators electrically coupled to the power rail: generating a rail voltage and a rail current to drive the power rail, each respective voltage regulator having an output interface coupled to the power rail and configured to provide the rail voltage and deliver up to a predefined regulator current to the power rail when the respective voltage regulator is in an operational mode; obtaining a control setting for each respective voltage regulator of the plurality of voltage regulators, the control setting for each respective voltage regulator determining whether the respective voltage regulator is a standby voltage regulator operating in a standby mode or is an operational voltage regulator operating in the operational mode; at each standby voltage regulator, enabling a bypass unit of the standby voltage regulator to bypass a feedback path from the output interface to an input of a voltage regulator controller, such that the standby voltage regulator does not deliver current to the power rail; and at each operational voltage regulator, disabling the bypass unit from bypassing the feedback path, such that the respective voltage regulator delivers current to the power rail.

Clause 20: The method of clause 19, wherein each respective voltage regulator includes one or more drive paths coupled to the output interface and configured to operate with an operating frequency, the voltage regulator controller of the respective voltage regulator having an output coupled to the one or more drive paths and the input coupled to the output interface by the feedback path, and configured to control the one or more drive paths, the bypass unit coupled to the one or more drive paths and the voltage regulator controller.

Clause 21: The method of clause 19, further comprising: determining the control setting for each respective voltage regulator coupled to the power rail dynamically and in real time based on a load condition and a power state policy associated with the power rail.

Clause 22: A non-transitory computer readable storage medium storing one or more programs configured for execution by an electronic device having a plurality of voltage regulators electrically coupled to a power rail, the one or more programs including instructions that, when executed by the electronic device, cause the electronic device to perform a method of any of clauses 19-22.

Clause 23: An apparatus for driving a power rail at an electronic device having a plurality of voltage regulators electrically coupled to the power rail, comprising at least one means for performing a method of any of clauses 19-22.

The above description has been provided with reference to specific implementations. However, the illustrative discussions above are not intended to be exhaustive or to be limiting to the precise forms disclosed. Many modifications and variations are possible in view of the above teachings. The implementations were chosen and described in order to best explain the principles disclosed and their practical applications, to thereby enable others to best utilize the disclosure and various implementations with various modifications as are suited to the particular use contemplated.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

What is claimed is:

1. An electronic device, comprising:
    a power rail configured to provide a rail voltage;
    a plurality of voltage regulators electrically coupled to the power rail and configured to provide the rail voltage collectively, each of the plurality of voltage regulators including:
        an output interface coupled to the power rail and configured to provide the rail voltage and deliver up to a predefined regulator current to the power rail;
        one or more drive paths coupled to the output interface and configured to operate with an operating frequency;
        a voltage regulator controller having an output coupled to the one or more drive paths and an input coupled to the output interface by a feedback path, and configured to control the one or more drive paths; and
        a bypass unit coupled to the one or more drive paths and the voltage regulator controller;
    wherein each respective voltage regulator of the plurality of voltage regulators is configured to operate, in accordance with a control setting, in either a standby mode in which the bypass unit is enabled to bypass the feedback path from the output interface to the input of the voltage regulator controller and the respective voltage regulator does not deliver current to the power rail, or an operational mode in which the bypass unit is disabled from bypassing the feedback path and the respective voltage regulator delivers up to the predefined regulator current to the power rail.

2. The electronic device of claim 1, wherein each respective voltage regulator of the plurality of voltage regulators is configured to transition, in accordance with a change in the control setting, from the standby mode to the operational mode, and to provide the predefined regulator current to the power rail within a predefined period of time.

3. The electronic device of claim 1, wherein for each respective voltage regulator, the control setting includes a control value and an operation enable signal, the control value defining a magnitude of the rail voltage, the operation enable signal configured to control the respective voltage regulator to operate in either the standby mode in which the bypass unit is enabled to bypass the feedback path or the operational mode in which the bypass unit is disabled from bypassing the feedback path.

4. The electronic device of claim 1, wherein each of the one or more drive paths further comprises:
  a passive load component coupled to the output interface;
  a driver configured to receive a periodic signal having an operating frequency and modulate the periodic signal to provide a switching signal with a distinct phase; and
  a power switching component coupled to the driver and the passive load component, the power switching component configured to couple the passive load component to one or more DC supply voltages under the control of the switching signal.

5. The electronic device of claim 4, wherein in the standby mode, the bypass unit is enabled to bypass the power switching component and the passive load component of each drive path, and each of the one or more drive paths further comprises:
  a first multiplexer coupled to the driver, the power switching component and the bypass unit, wherein the first multiplexer is configured to be controlled by the control setting to enable the standby mode in which the first multiplexer selects an access to the bypass unit and deselects an access to the power switching component to be electrically coupled to the driver of the drive path.

6. The electronic device of claim 5, each respective voltage regulator further comprising:
  a second multiplexer coupled to the input of the voltage regulator controller, the output interface of the power rail, and an output of the bypass unit, wherein the second multiplexer is configured to be controlled by the control setting, concurrently with the first multiplexer, to enable the standby mode in which the second multiplexer selects the output of the bypass unit and deselects the output interface of the power rail to be coupled to the input of the voltage regulator controller.

7. The electronic device of claim 4, wherein:
  the bypass unit includes one or more bypass paths, each bypass path including a respective bypass switching component having a bypass switching transistor of a first size;
  the power switching component of each driver path has a path switching transistor having a second size; and
  the second size of the path switching transistor is greater than the first size of the bypass switching transistor.

8. The electronic device of claim 1, wherein the plurality of voltage regulators are electrically coupled to a power array controller, and the power array controller is configured to determine the control setting for each voltage regulator coupled to the power rail.

9. The electronic device of claim 8, wherein for each voltage regulator, the control setting is adjusted by the power array controller dynamically and in real time based on a load condition and a power state policy associated with the power rail.

10. The electronic device of claim 1, wherein the bypass unit includes one or more bypass paths, each bypass path having a respective bypass switching component and a respective dummy load component that is coupled between the bypass switching component and an output of the bypass unit, each bypass path configured to bypass a respective drive path of the feedback path in the standby mode.

11. The electronic device of claim 10, wherein for each bypass path, the respective dummy load component includes an active filter.

12. The electronic device of claim 11, wherein the active filter is a second order Sallen-Key filter.

13. The electronic device of claim 1, wherein for each respective voltage regulator, the bypass unit is electrically decoupled from the power rail in the standby mode, and configured to output the rail voltage and provide the rail voltage to the input of the voltage regulator controller in the standby mode, such that when the standby mode is changed to the operational mode, the respective voltage regulator can provide the predefined regulator current to the power rail within a predefined period of time.

14. The electronic device of claim 1, wherein:
  the bypass unit includes one or more bypass switching components and a dummy load component that is coupled between the one or more bypass switching components and an output of the bypass unit; and
  each bypass switching component is coupled to a respective drive path in the standby mode.

15. The electronic device of claim 14, wherein the dummy load component includes one of an active filter, and the active filter is a Sallen-Key filter.

16. The electronic device of claim 1, wherein:
  the plurality of voltage regulators include a first voltage regulator, a second voltage regulator, and a third voltage regulator;
  each of the first and second voltage regulators operates to drive the power rail in the operational mode, and the feedback path of the respective voltage regulator is enabled between the output interface and the input of the respective voltage regulator in the operational mode;
  the third voltage regulator is electrically decoupled from the power rail in the standby mode in which the bypass unit of the third voltage regulator is enabled to bypass the feedback path of the third voltage regulator.

17. The electronic device of claim 1, wherein the plurality of voltage regulators coupled to the power rail are identical to each other.

18. The electronic device of claim 1, wherein:
  each voltage regulator has a first alternating current (AC) loop response in the standby mode, the first AC loop response having a first low frequency gain, a first cutoff frequency and a first phase margin;
  each voltage regulator has a second AC loop response in the operational mode, the second AC loop response having a second low frequency gain, a second cutoff frequency and a second phase margin;
  a first difference between the first and second low frequency gains is less than a first threshold;
  a second difference between the first and second cutoff frequencies is less than a second threshold; and a third difference between the first and second phase margin is less than a third threshold.

19. A method for driving a power rail, further comprising:
at an electronic device having a plurality of voltage regulators electrically coupled to the power rail:
generating a rail voltage and a rail current to drive the power rail, each respective voltage regulator having an output interface coupled to the power rail and configured to provide the rail voltage and deliver up to a predefined regulator current to the power rail when the respective voltage regulator is in an operational mode;
obtaining a control setting for each respective voltage regulator of the plurality of voltage regulators, the control setting for each respective voltage regulator determining whether the respective voltage regulator is a standby voltage regulator operating in a standby mode or is an operational voltage regulator operating in the operational mode;
at each standby voltage regulator, enabling a bypass unit of the standby voltage regulator to bypass a feedback path from the output interface to an input of a voltage regulator controller, such that the standby voltage regulator does not deliver current to the power rail; and
at each operational voltage regulator, disabling the bypass unit from bypassing the feedback path, such that the respective voltage regulator delivers current to the power rail.

20. The method of claim 19, wherein each respective voltage regulator includes one or more drive paths coupled to the output interface and configured to operate with an operating frequency, the voltage regulator controller of the respective voltage regulator having an output coupled to the one or more drive paths and the input coupled to the output interface by the feedback path, and configured to control the one or more drive paths, the bypass unit coupled to the one or more drive paths and the voltage regulator controller.

21. The method of claim 19, further comprising:
determining the control setting for each respective voltage regulator coupled to the power rail dynamically and in real time based on a load condition and a power state policy associated with the power rail.

22. A non-transitory computer readable storage medium storing one or more programs configured for execution by an electronic device having a plurality of voltage regulators electrically coupled to a power rail, the one or more programs including instructions that, when executed by the electronic device, cause the electronic device to perform:
generating a rail voltage and a rail current to drive the power rail, each respective voltage regulator having an output interface coupled to the power rail and configured to provide the rail voltage and deliver up to a predefined regulator current to the power rail when the respective voltage regulator is in an operational mode;
obtaining a control setting for each respective voltage regulator of the plurality of voltage regulators, the control setting for each respective voltage regulator determining whether the respective voltage regulator is a standby voltage regulator operating in a standby mode or is an operational voltage regulator operating in the operational mode;
at each standby voltage regulator, enabling a bypass unit of the standby voltage regulator to bypass a feedback path from the output interface to an input of a voltage regulator controller, such that the standby voltage regulator does not deliver current to the power rail; and
at each operational voltage regulator, disabling the bypass unit from bypassing the feedback path, such that the respective voltage regulator delivers current to the power rail.

23. The non-transitory computer readable storage medium of claim 22, wherein each respective voltage regulator of the plurality of voltage regulators is configured to transition, in accordance with a change in the control setting, from the standby mode to the operational mode, and to provide the predefined regulator current to the power rail within a predefined period of time.

24. The non-transitory computer readable storage medium of claim 22, wherein for each respective voltage regulator, the control setting includes a control value and an operation enable signal, the control value defining a magnitude of the rail voltage, the operation enable signal configured to control the respective voltage regulator to operate in either the standby mode in which the bypass unit is enabled to bypass the feedback path or the operational mode in which the bypass unit is disabled from bypassing the feedback path.

25. An apparatus for driving a power rail at an electronic device having a plurality of voltage regulators electrically coupled to the power rail, comprising:
means for generating a rail voltage and a rail current to drive the power rail, each respective voltage regulator having an output interface coupled to the power rail and configured to provide the rail voltage and deliver up to a predefined regulator current to the power rail when the respective voltage regulator is in an operational mode;
means for obtaining a control setting for each respective voltage regulator of the plurality of voltage regulators, the control setting for each respective voltage regulator determining whether the respective voltage regulator is a standby voltage regulator operating in a standby mode or is an operational voltage regulator operating in the operational mode;
means for, at each standby voltage regulator, enabling a bypass unit of the standby voltage regulator to bypass a feedback path from the output interface to an input of a voltage regulator controller, such that the standby voltage regulator does not deliver current to the power rail; and
means for, at each operational voltage regulator, disabling the bypass unit from bypassing the feedback path, such that the respective voltage regulator delivers current to the power rail.

26. The apparatus of claim 25, wherein each respective voltage regulator includes one or more drive paths coupled to the output interface and configured to operate with an operating frequency, the voltage regulator controller of the respective voltage regulator having an output coupled to the one or more drive paths and the input coupled to the output interface by the feedback path, and configured to control the one or more drive paths, the bypass unit coupled to the one or more drive paths and the voltage regulator controller.

27. The apparatus of claim 25, further comprising:
means for determining the control setting for each respective voltage regulator coupled to the power rail dynamically and in real time based on a load condition and a power state policy associated with the power rail.

* * * * *